(12) United States Patent
Miyakawa et al.

(10) Patent No.: US 6,522,569 B2
(45) Date of Patent: Feb. 18, 2003

(54) SEMICONDUCTOR MEMORY DEVICE

(75) Inventors: Tadashi Miyakawa, Yokohama (JP); Yukihito Oowaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/956,000

(22) Filed: Sep. 20, 2001

(65) Prior Publication Data

US 2002/0034091 A1 Mar. 21, 2002

(30) Foreign Application Priority Data

Sep. 20, 2000 (JP) ........................................ 2000-284709

(51) Int. Cl.[7] .............................................. G11C 11/12
(52) U.S. Cl. .................... 365/145; 365/149; 365/189.04
(58) Field of Search ................................ 365/145, 149, 365/65, 203, 230.03, 117, 189.01, 189.04

(56) References Cited

U.S. PATENT DOCUMENTS 5,903,492 A    5/1999  Takashima
6,198,652 B1 *  3/2001  Kawakubo et al. .......... 365/145
2002/0021579 A1 *  2/2002  Takashima ................... 365/145
2002/0027797 A1 *  3/2002  Takashima ................... 365/145

* cited by examiner

*Primary Examiner*—David Nelms
*Assistant Examiner*—Thong Le
(74) *Attorney, Agent, or Firm*—Banner & Witcoff, Ltd.

(57) ABSTRACT

In a semiconductor memory device, a plurality of memory cells is coupled in series to form a memory cell block, which data is read out and data is written in, each memory cell having a cell transistor for selecting the memory cell and a ferroelectric capacitor coupled between a source and a drain of the cell transistor. The word line is coupled to a gate of the cell transistor. The memory cell block selection transistor is coupled to one terminal of the memory cell block of the plurality of memory cells. The bit line is coupled to the memory cell block selection transistor. The plate line is coupled to the other terminal of the memory cell block of the plurality of memory cells. The word line control circuit controls the word line to keep the cell transistor selected even after the memory cell block selection transistor is turned off.

23 Claims, 27 Drawing Sheets

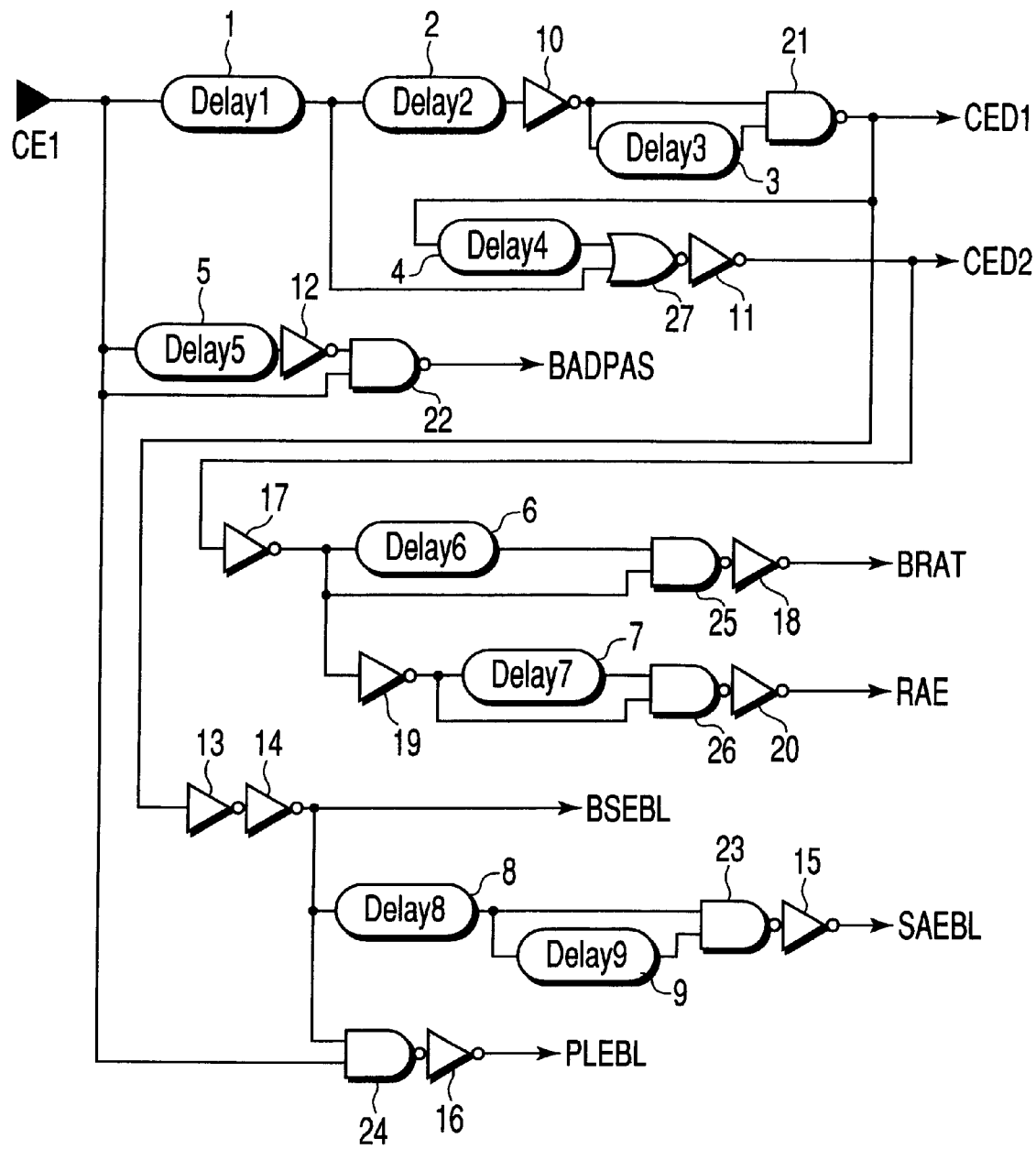
F I G. 1

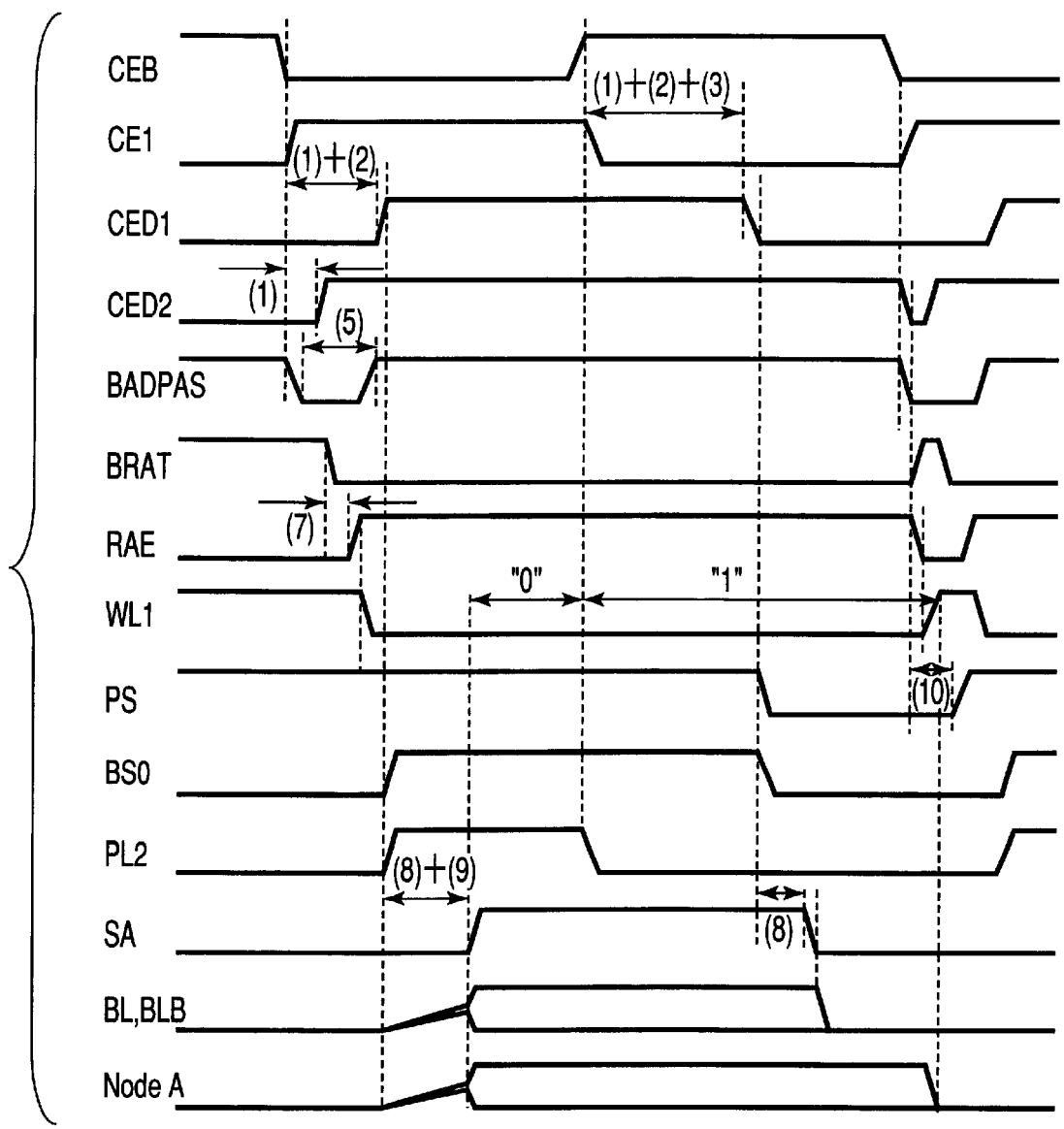
F I G. 18

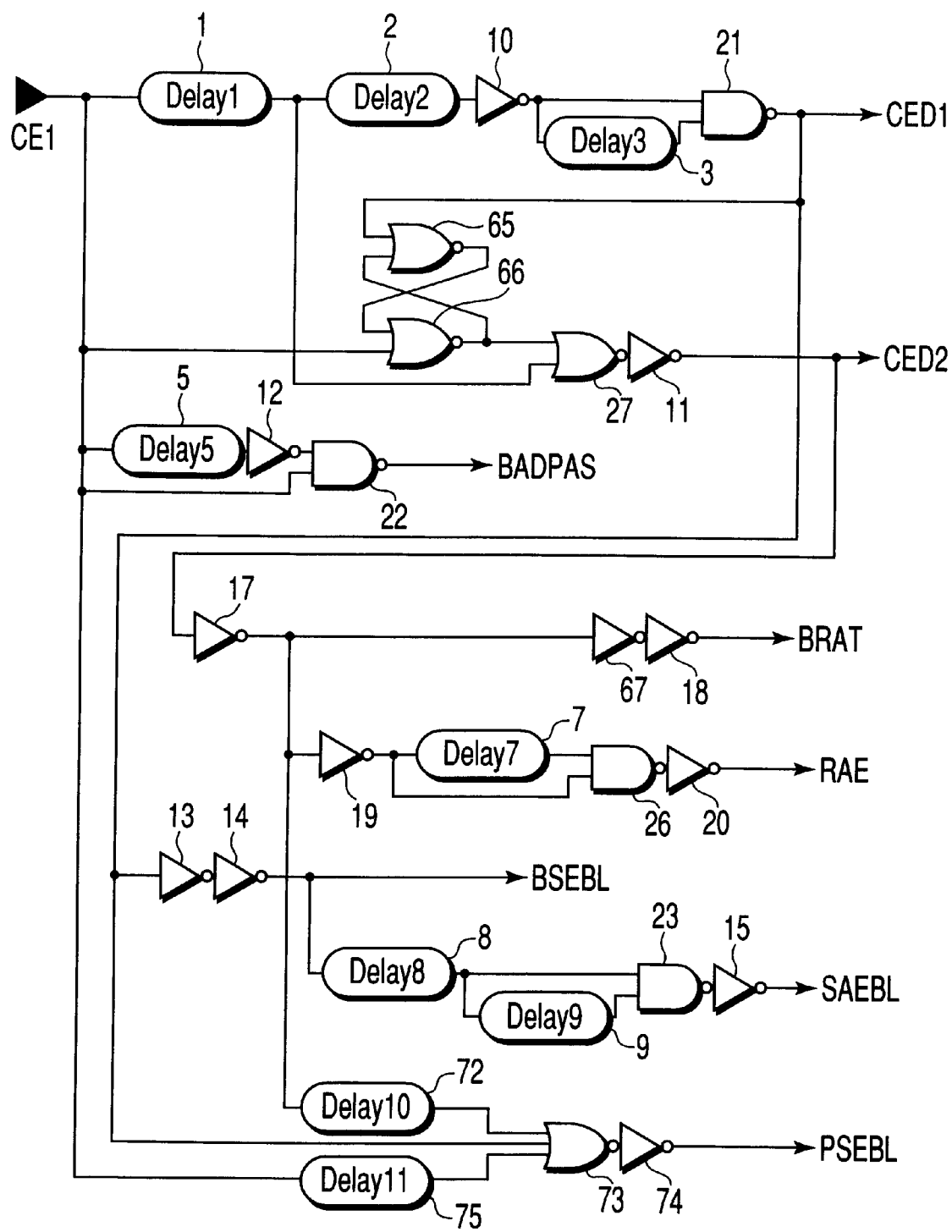
F I G. 21

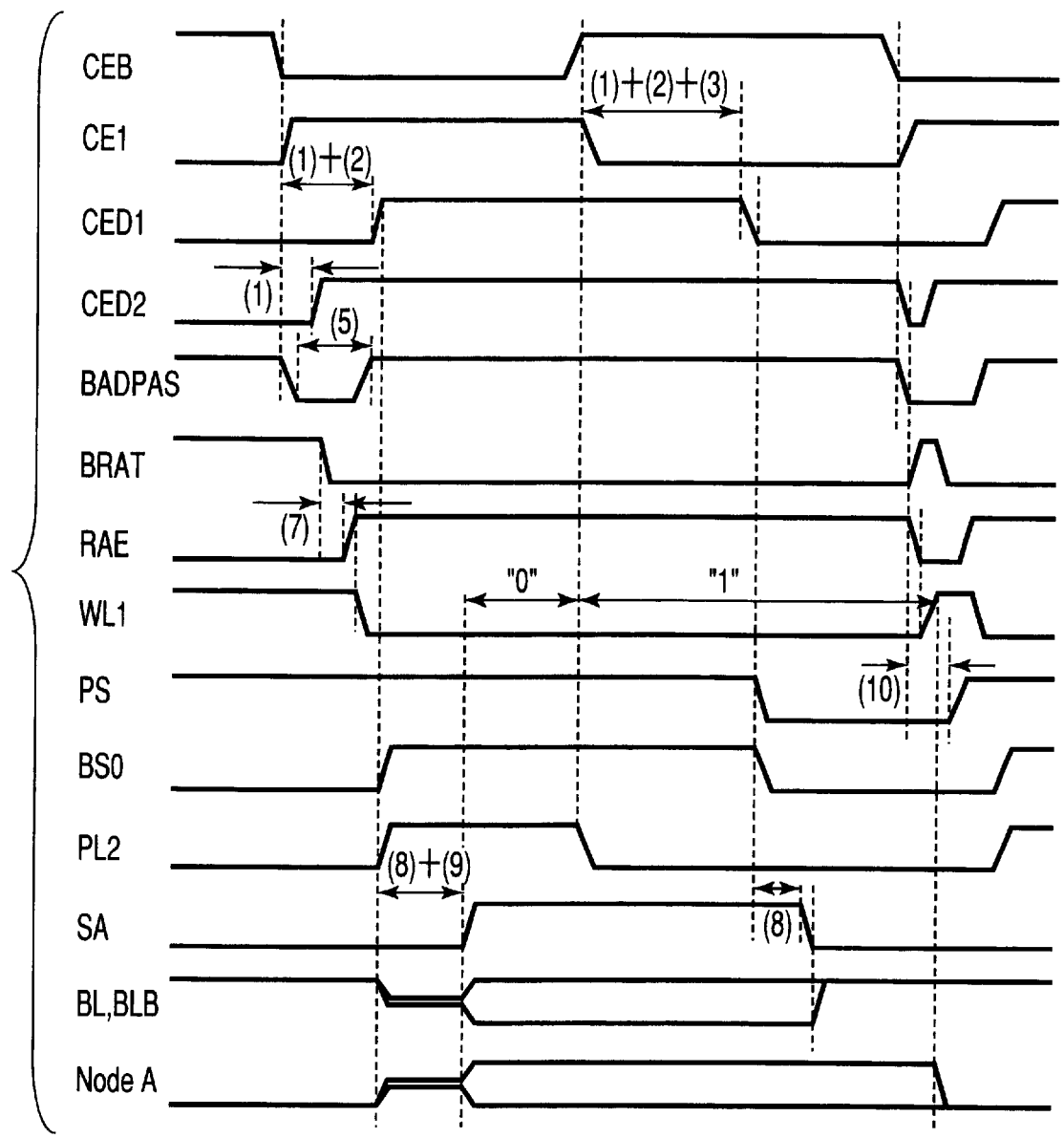
F I G. 26

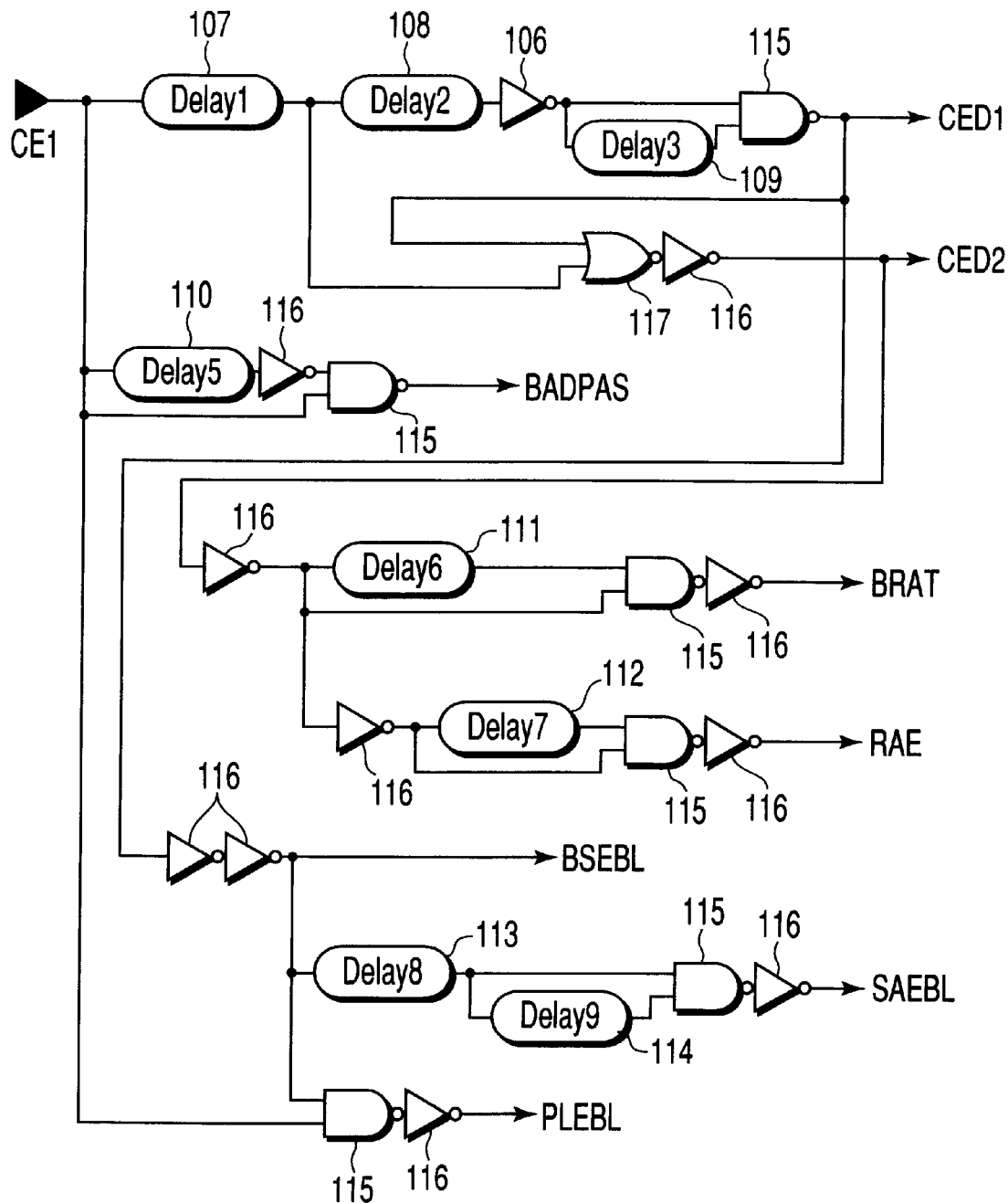
F I G. 29

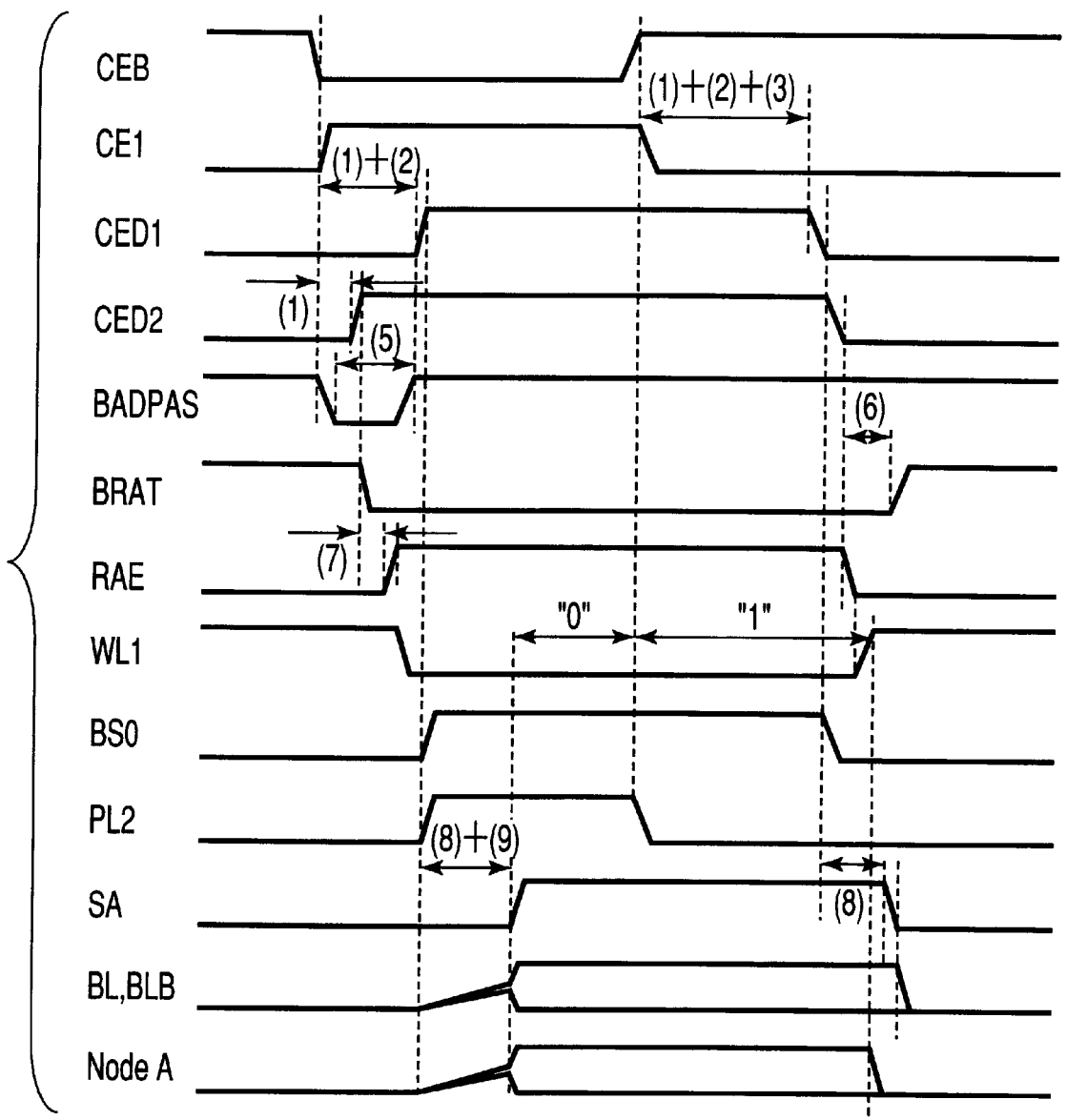
F I G. 30

SEMICONDUCTOR MEMORY DEVICE

CROSS-REFERENCE TO RELATED APPLICATIONS

This application is based upon and claims the benefit of priority from the prior Japanese Patent Application No. 2000-284709, filed Sep. 20, 2000, the entire contents of which are incorporated herein by reference.

BACKGROUND OF THE INVENTION

1. Field of the Invention

The present invention relates to a semiconductor memory device using a ferroelectric film and, more particularly, to a highly integrated semiconductor memory device.

2. Description of the Related Art

A ferroelectric memory is advantageous because it is nonvolatile like a flash memory and is capable of not only a high-speed access and write like a DRAM but also low-voltage/low-power operation. For the cell structure of a ferroelectric memory, a 1-transistor/1-capacitor memory cell like a DRAM cell has been widely developed.

A ferroelectric memory cell stores the "1" or "0" state depending on whether the polarization is directed upward or downward, as shown in FIG. 27. As shown in FIG. 27, a cell transistor 100, which has a gate connected to a word line WL and a source connected to a bit line BL, is connected to a node C, i.e., an electrode of a capacitor 101 with other electrode connected to a plate line PL. The polarization amount of the ferroelectric capacitor depends on the time of voltage application to the ferroelectric capacitor. When the time is prolonged, the polarization amount becomes close to the saturated polarization amount. For this reason, even in a device, when the write time is prolonged, a sufficient polarization amount can be obtained, and the data holding characteristic improves.

In a conventional general 1-transistor/1-capacitor memory cell, to increase the reliability of cell data holding, the voltage across the ferroelectric capacitor is held after the data write to obtain sufficient polarization. That is, after the active state is ended, the word line is set in the unselected state to confine the bit line potential in the node C shown in FIG. 27. In this state, a write potential is applied to the ferroelectric capacitor by the potential difference between the node C and the plate line PL, thereby sufficiently writing the data.

A ferroelectric memory (to be referred to as a TC parallel unit series connection type ferroelectric memory hereinafter) has received a great deal of attention because of its high operation speed and high degree of integration, in which a unit cell is formed by connecting the two terminals of a capacitor (C) between the source and the drain of a cell transistor (T) and connecting a plurality of unit cells in series. This ferroelectric memory is described in "A Sub-40 ns Random-Access Chain FRAM Architecture with a 7 ns Cell-Plate-Line Drive,", ISSCC Tech. Dig. Papers, pp. 102–103, Feb. 1999.

In this structure, a cell transistor 102 formed from an n-channel transistor and a capacitor 103 are connected in parallel to form one memory cell 104, as shown in FIG. 28. A plurality of memory cells 104 are connected in series to form a memory cell block 105. Pairs of memory cell blocks 105 are laid out in multiple stages (one stage in FIG. 28), and each of the paired memory cell blocks 105 is arranged between a corresponding one of bit lines BL and BLB and a corresponding one of plate lines PL1 and PL2. Block selection transistors 106 with gates connected to block selection lines BS0 and BS1 are connected between the bit lines BL and BLB and the memory cells 104 in the respective memory cell blocks 105.

In the standby mode, all the word lines WL are set at "H" level, and the two electrodes of each capacitor are short-circuited. In the active mode, a selected word line WL changes from "H" level to "L" level, and the block selection line BS changes from "L" level to "H" level. After that, the plate line PL changes to Vdd level to apply a Vdd potential to a selected capacitor. Data is read from the memory cell to the bit line BL. An unselected capacitor is held in the short-circuit state. In this way, a random access is done.

FIG. 29 is a view showing the arrangement of a control circuit for controlling a read/write from/to a memory cell. This control circuit has multiple stages of first to third and fifth to ninth delay circuits 107 to 114 connected in series, NAND circuit 115, inverter circuit 116, and NOR circuit 117. The control circuit receives a chip enable signal CE1 and generates and outputs two chip enable delay signals CED1 and CED2, address pass signal BADPAS, row address latch signal BRAT, row address enable signal RAE, block selection enable signal BSEBL, sense amplifier enable signal SAEBL, and plate line enable signal PLEBL.

The first chip enable delay signal CED1 controls signals for driving a block selection line drive circuit (not shown), plate line PL, and sense amplifier (not shown) which control the memory cell array. The second chip enable delay signal CED2 controls an address buffer (not shown) to control the timing of the word line WL and also controls the row address latch signal BRAT and row address enable signal RAE for driving the address buffer. The address pass signal BADPAS controls the timing to send an external address signal to the address buffer. The block selection enable signal BSEBL controls the block selection line drive circuit. The sense amplifier enable signal SAEBL controls the sense amplifier. The plate line enable signal PLEBL controls the plate line PL.

The chip enable signal CE1 is the output signal from an input buffer (not shown) for receiving an external signal CEB, and is set at "H" level in the active mode and at "L" level at the standby mode.

FIG. 30 is a timing chart showing input and output signals and signals at the respective nodes in the circuits, shown in FIGS. 28 and 29, of the conventional TC parallel unit series connection type ferroelectric memory in the read mode. Referring to FIG. 30, the signals are synchronized at timings indicated by dotted lines.

The external chip enable signal CEB changes from "H" level to "L" level only during a predetermined period.

When the external chip enable signal CEB has changed from "H" level to "L" level, the chip enable signal CE1 output from a chip enable buffer changes from "L" level to "H" level. When the external chip enable signal CEB has changed from "L" level to "H" level, the chip enable signal CE1 changes from "H" level to "L" level.

After the elapse of time (1)+time (2) from the timing when the chip enable signal CE1 changes from "L" level to "H" level, the first chip enable delay signal CED1 changes from "L" level to "H" level. After the elapse of times (1) and (2)+time (3) from the timing when the chip enable signal CE1 changes from "H" level to "L" level, the first chip enable delay signal CED1 changes from "H" level to "L" level. The total time (1)+(2)+(3) is about 20 nsec.

After the elapse of time (1) from the timing when the chip enable signal CE1 changes from "L" level to "H" level, the second chip enable delay signal CED2 changes from "L" level to "H" level. When the first chip enable delay signal CED1 has changed to "L" level, the second chip enable delay signal CED2 changes from "H" level to "L" level.

When the chip enable signal CE1 changes from "L" level to "H" level, the address pass signal BADPAS simultaneously changes from "H" level to "L" level.

After the elapse of time (5) from the change to "L" level, the address pass signal BADPAS changes from "" level to "H" level again.

When the second chip enable delay signal CED2 has changed from "L" level to "H" level, the row address latch signal BRAT changes from "H" level to "L" level. After the elapse of time (6) from the timing when the change of second chip enable delay signal CED2 has changed from "H" level to "L" level, the row address latch signal BRAT changes from "L" level to "H" level.

After the elapse of time (7) from the timing when the second chip enable delay signal CED2 has changed from "L" level to "H" level, the row address enable signal RAE changes from "L" level to "H" level. When the second chip enable delay signal CED2 has changed from "H" level to "L" level, the row address enable signal RAE changes from "H" level to "L" level.

When the row address enable signal RAE has changed from "L" level to "H" level, the word line WL1 is selected by a decoder (not shown), and its potential changes from "H" level to "L" level. When the row address enable signal RAE has changed from "H" level to "L" level, the word line WL1 is unselected, and its potential changes from "L" level to "H" level.

When the first chip enable delay signal CED1 has changed from "L" level to "H" level, the potential of the block selection line BS0 changes from "L" level to "H" level. When the first chip enable delay signal CED1 has changed from "H" level to "L" level, the block selection line BS0 changes from "H" level to "L" level. When the block selection line BS0 is at "H" level, the bit line and memory cell are connected.

When the first chip enable delay signal CED1 has changed from "L" level to "H" level, the potential of the plate line PL2 changes from "L" level to "H" level. When the chip enable signal CE1 changes from "H" level to "L" level, the potential of the plate line PL2 simultaneously changes from "H" level to "L" level.

After the elapse of time (8)+time (9) from the timing when the first chip enable delay signal CED1 has changed from "L" level to "H" level, a sense amplifier control signal SA changes from "L" level to "H" level. After the elapse of time (8) from the timing when the first chip enable delay signal CED1 has changed from "H" level to "L" level, the sense amplifier control signal SA changes from "H" level to "L" level.

When the potential of the plate line PL2 changes from "L" level to "H" level, charges are transferred from the selected memory cell to the bit line BLB, and the bit line BLB is set at a potential corresponding to the data in the memory cell. When the sense amplifier control signal SA changes from "L" level to "H" level, the potential of the bit line BLB is amplified to "H" level to "L" level in accordance with the data in the memory cell by the operation of the sense amplifier. If at "H" level, the potential of the bit line BLB changes to "L" level when the sense amplifier control signal SA has changed from "H" level to "L" level.

After the block selection line BS0 has changed from "L" level to "H" level, the potential of a node A is connected to the bit line BLB. When the plate line PL2 changes from "L" level to "H" level, the bit line BLB changes to a bit line potential corresponding to the data in the memory cell, and the node A also changes to the bit line potential. When the sense amplifier control signal SA changes from "L" level to "H" level, the node A changes to "H" level or "L" level, like the bit line. When the block selection line BS0 changes from "H" level to "L" level and then the potential of the word line WL1 changes from "L" level to "H" level, the cell transistor 102 is turned on, and the nodes A and B are short-circuited. At this time, since all the cell transistors of the memory cells are ON, the potentials of the nodes A and B equal the level of the plate line PL2.

The conventional semiconductor memory device with the above structure has the following problems.

In the cell structure of the conventional TC parallel unit series connection type ferroelectric memory, when a word line is set in the unselected state simultaneously with the end of the active state, as in a conventional 1-transistor/1-capacitor memory cell, the two terminals of the ferroelectric capacitor are short-circuited. For this reason, the write voltage cannot be continuously applied.

That is, in the cell structure of the conventional TC parallel unit series connection type ferroelectric memory, it is difficult to ensure a long rewrite time and write time, which are available in a 1-transistor/1-capacitor cell, and obtain the same write characteristic as in the 1-transistor/1-capacitor cell.

Especially, when a high-speed write with a write time of 10 to 40 nsec is executed, and the write voltage varies within the range of 10 mV and 20 mV, the data holding characteristic changes depending on the characteristics of a ferroelectric thin film.

Particularly, in rewrite operation after a read, the potential of the selected word line WL for which the write is instructed quickly changes from "L" level to "H" level after the block selection line BS changes from "H" level to "L" level.

As described above, in the conventional semiconductor memory device, since the block selection line BS and word line WL are almost simultaneously set in the unselected state, a sufficient time for the rewrite cannot be ensured.

As indicated on the signal waveform of the potential of the word line WL1 shown in FIG. 30, a "0" rewrite time and "1" write time are set. Especially, the "1" rewrite time is set to about 20 ns in accordance with the delay times (1), (2), and (3) by the delay circuits 1 to 3.

For this reason, the cell is not sufficiently polarized, and the bit line potential in the read becomes low. Hence, the data holding characteristic degrades, and the reliability considerably decreases.

BRIEF SUMMARY OF THE INVENTION

According to an aspect of the present invention, there is provided a semiconductor memory device comprising: a plurality of memory cells coupled in series to form a memory cell block, which data is read out and data is written in, each memory cell having a cell transistor for selecting the memory cell and a ferroelectric capacitor coupled between a source and a drain of the cell transistor; a word line coupled to a gate of the cell transistor; a memory cell block selection transistor coupled to one terminal of the memory cell block of the plurality of memory cells;

a bit line coupled to the memory cell block selection transistor; a plate line coupled to the other terminal of the memory cell block of the plurality of memory cells; and a word line control circuit for controlling the word line to keep the cell transistor selected even after the memory cell block selection transistor is turned off.

According to another aspect of the present invention, there is further provided a semiconductor memory device comprising: a plurality of memory cells coupled in series to form a memory cell block, which data is read out and data is written in, each memory cell having a cell transistor for selecting the memory cell and a ferroelectric capacitor coupled between a source and a drain of the cell transistor; a word line coupled to a gate of the cell transistor; a memory cell block selection transistor coupled to one terminal of the memory cell block of the plurality of memory cells; a bit line coupled to the memory cell block selection transistor; a plate line selection transistor coupled to the other terminal of the memory cell block of the plurality of memory cells; a plate line connected to the plate line selection transistor; and a word line control circuit for controlling the word line to keep the cell transistor selected even after the memory cell block selection transistor and the plate line selection transistor are turned off.

BRIEF DESCRIPTION OF THE SEVERAL VIEWS OF THE DRAWING

FIG. 1 is a view showing the arrangement of a control circuit according to the first embodiment of the present invention;

FIG. 18 is a timing chart showing operation according to the sixth embodiment of the present invention;

FIG. 21 is a view showing the arrangement of a control circuit according to the eighth embodiment of the present invention;

FIG. 26 is a timing chart showing operation according to the twelfth embodiment of the present invention;

FIG. 29 is a view showing the arrangement of the control circuit of the conventional ferroelectric memory; and FIG. 30 is a timing chart showing the operation of the conventional ferroelectric memory.

DETAILED DESCRIPTION OF THE INVENTION

Figure 2:
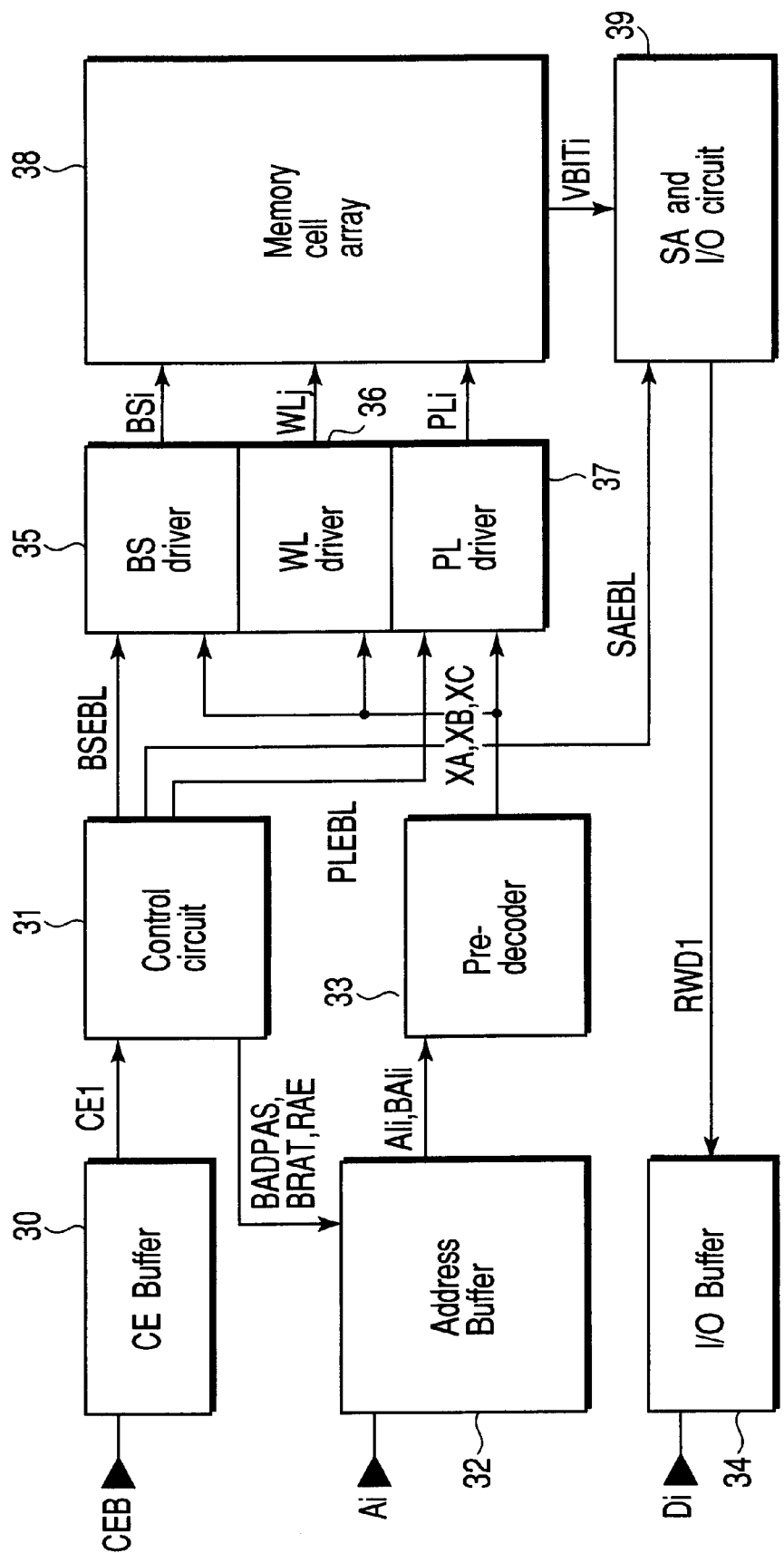
FIG. 2 is a block diagram showing the arrangement of a semiconductor memory device according to the first to fourth embodiments of the present invention.

The embodiments of the present invention will be described next with reference to the accompanying drawing. The same or similar reference numerals denote the same or similar parts throughout the drawing.

FIRST EMBODIMENT

A semiconductor memory device according to the first embodiment of the present invention will be described with reference to FIGS. 1 to 6.

FIG. 2 is a block diagram showing the arrangement of the semiconductor memory device according to the first embodiment of the present invention.

A chip enable buffer 30 that receives an external signal CEB outputs a chip enable signal CE1 to a control circuit 31. The control circuit 31 outputs to an address buffer 32 an address pass signal BADPAS, row address latch signal BRAT, and row address enable signal RAE.

The address buffer 32 receives an external address signal Ai and outputs address signals Ali and BAli to a pre-decoder 33 (i is an integer equal to or larger than 0).

An input/output (I/O) buffer 34 receives/outputs data Di.

A block selection line control circuit 35 receives a block selection enable signal BSEBL from the control circuit 31 and also receives address signals XA, XB, and XC from the pre-decoder 33.

A word line drive circuit 36 receives the address signals XA, XB, and XC from the pre-decoder 33.

A plate line control circuit 37 receives a plate line enable signal PLEBL from the control circuit 31 and also receives the address signals XA, XB, and XC from the pre-decoder 33.

A memory cell array 38 receives a plurality of block selection signals BSi decoded by the address signals XA, XB, and XC from the block selection line control circuit 35, a plurality of word lines WLj (j is an integer equal to or larger than 0) decoded by the address signals XA, XB, and XC from the word line drive circuit 36, and the potentials of a plurality of plate lines PLi decoded by the address signals XA, XB, and XC from the plate line control circuit 37. The memory cell array 38 outputs a data line potential VBITi.

A sense amplifier (SA) and I/O circuit 39 receives the data line potential VBITi from the memory cell array 38 and also a sense amplifier enable signal SAEBL from the control circuit 31. The sense amplifier and I/O circuit 39 outputs read/write data RWDi to the input/output buffer 34.

FIG. 1 is a view showing the arrangement of the control circuit 31 according to the first embodiment of the present invention. This control circuit has first to ninth delay circuits 1 to 9, first to 11th inverters 10 to 20, first to sixth NAND circuits 21 to 26, and first NOR circuit 27. Each delay circuit is formed by, e.g., connecting an even number of inverters in series.

The chip enable signal CE1 is input to the first delay circuit 1, which outputs a delayed signal to the second delay circuit 2 and first NOR circuit 27.

The second delay circuit 2 outputs a signal to the first inverter 10. The first inverter 10 outputs a signal to the third delay circuit 3 and first NAND circuit 21.

The first NAND circuit 21 outputs a first chip enable delay signal CED1. The output signal CED1 is input to the fourth delay circuit 4 and fourth inverter 13.

The fourth delay circuit 4 outputs a signal to the first NOR circuit 27. The first NOR circuit 27 outputs a signal to the second inverter 11. The second inverter 11 outputs a second chip enable delay signal CED2. This signal is output to the eighth inverter 17.

The fifth delay circuit 5 receives the chip enable signal CE1 and outputs a signal to the third inverter 12. The output from the third inverter 12 and the chip enable signal CE1 are input to the second NAND circuit 22. The second NAND circuit 22 outputs the address pass signal BADPAS.

The fourth inverter 13 outputs a signal to the fifth inverter 14. The fifth inverter 14 outputs the block selection enable signal BSEBL. This signal is output to the eighth delay circuit 8 and fourth NAND circuit 24.

The eighth delay circuit 8 outputs a signal to the ninth delay circuit 9 and third NAND circuit 23.

The ninth delay circuit 9 outputs a signal to the third NAND circuit 23.

The third NAND circuit 23 outputs a signal to the sixth inverter 15.

The sixth inverter 15 outputs the sense amplifier enable signal SAEBL.

The fourth NAND circuit 24 receives the chip enable signal CE1 and outputs a signal to the seventh inverter 16. The seventh inverter 16 outputs a plate line enable signal PLEBL.

The eighth inverter 17 outputs a signal to the sixth delay circuit 6, fifth NAND circuit 25, and 10th inverter 19.

The sixth delay circuit 6 outputs a signal to the fifth NAND circuit 25. The fifth NAND circuit 25 outputs a signal to the ninth inverter 18. The ninth inverter 18 outputs the row address latch signal BRAT.

The 10th inverter 19 outputs a signal to the seventh delay circuit 7 and sixth NAND circuit 26. The seventh delay circuit 7 outputs a signal to the sixth NAND circuit 26. The sixth NAND circuit 26 outputs a signal to the 11th inverter 20.

The 11th inverter 20 outputs the row address enable signal RAE.

Figure 3:
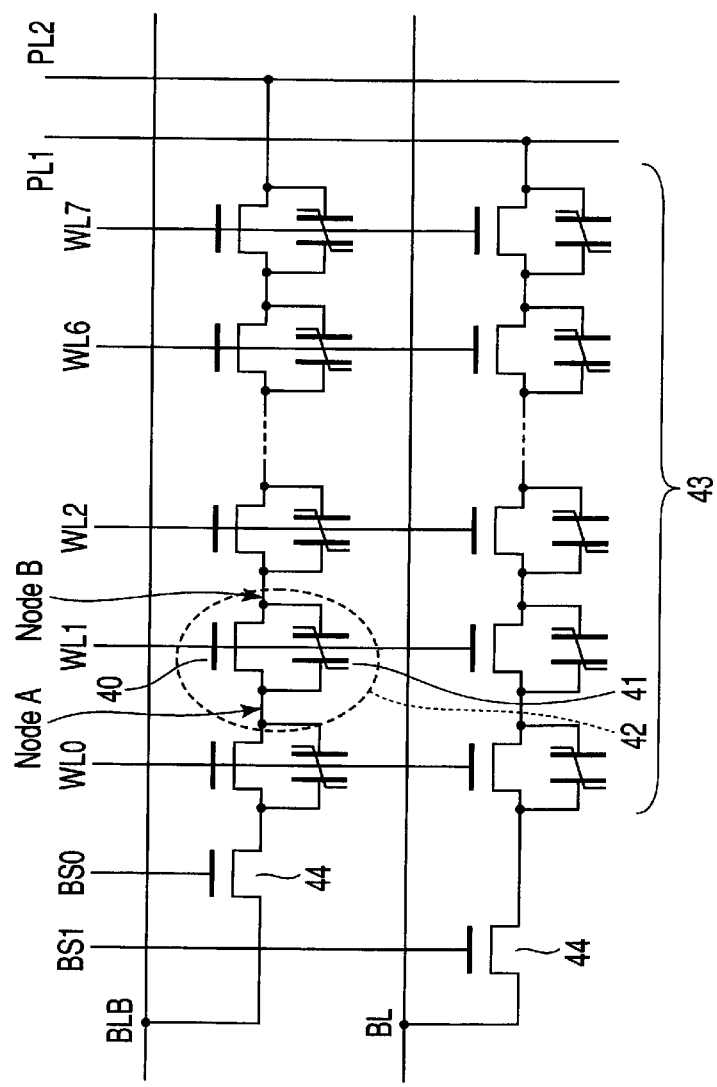
FIG. 3 is a circuit diagram showing the structure of a memory cell array according to the first to fourth embodiments of the present invention.

FIG. 3 is a circuit diagram showing the structure of the a TC (Transistor-Capacitor) parallel unit series connection type ferroelectric memory cell array 38 of the ferroelectric memory according to the first embodiment of the present invention.

The ferroelectric memory cell array 38 shown in FIG. 3 is formed from a plurality of ferroelectric memory cells (to be referred to as memory cells hereinafter) 42 each having one n-channel cell transistor 40 at the intersection between a word line and a bit line and one ferroelectric capacitor 41 connected between the source and the drain of the cell transistor 40.

For example, a plurality of pairs of memory cell groups 43 each having eight memory cells 42 connected in series are laid out in multiple stages (FIG. 3 shows a pair of memory cell groups 43). One terminal of each memory cell group 43 is connected to a corresponding one of bit lines BL and BLB through a selection transistor 44 controlled by one of block selection signals BS0 and BS1. The other terminal is connected to a corresponding one of plate lines PL1 and PL2.

The gate of the cell transistor 40 in the memory cell 42 is connected to, e.g., a word line WL1 as a memory cell selection line. When a word line drive signal input to the word line WL1 is at "H" level the cell transistor 40 sets, to an equipotential, the two electrodes of the capacitor 41 connected between its source and the drain, thereby setting the capacitor 41 in the unselected state. When the word line drive signal is at "L" level, the cell transistor 40 is turned off, and a capacitor 41 connected between its source and the drain is selected. The number of memory cells may be 16 or any other number.

Figure 4:
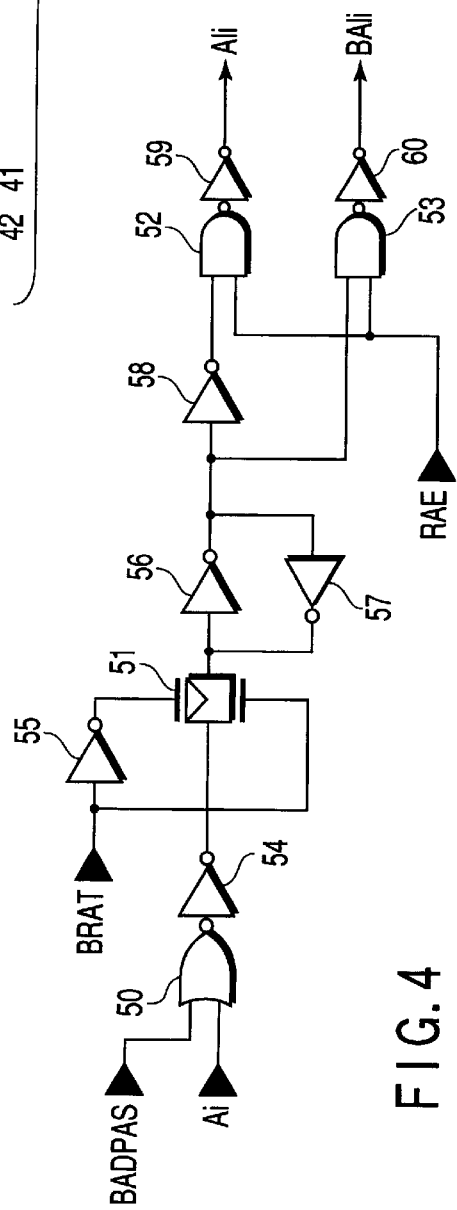
FIG. 4 is a circuit diagram showing an address buffer according to the first to twelfth embodiments of the present invention.

FIG. 4 is a circuit diagram showing the circuit arrangement of the address buffer 32 according to this embodiment.

A NOR circuit 50 receives the address pass signal BADPAS and address signal Ai and outputs a signal to a first inverter 54.

The first inverter 54 outputs a signal to one of the two source-drain nodes of a transfer gate 51 which is formed by connecting in parallel two transistors with sources and drains connected to each other.

One of the two gates of the transfer gate 51 is connected to the row address latch signal BRAT. The row address latch signal BRAT is input to a second inverter 55. The output signal from the second inverter 55 is input to the other of the two gates of the transfer gate 51.

The other of the two source-drain nodes of the transfer gate 51 is connected to one of two nodes of third and fourth inverters 56 and 57 having their input and output terminals cross-coupled.

The other of the two nodes of the third and fourth inverters 56 and 57 is connected to the input terminals of a fifth inverter 58 and second NAND circuit 53.

The output signal from the fifth inverter 58 and the row address enable signal RAE are input to a first NAND circuit 52.

The output signal from the first NAND circuit 52 is input to a sixth inverter 59. The sixth inverter 59 outputs the address signal Ali.

The second NAND circuit 53 receives the row address enable signal RAE and outputs a signal to a seventh inverter 60. The seventh inverter 60 outputs the address signal BAli.

In the address buffer 32, the output level of the inverter 54 is determined in accordance with the address signal Ai while the address-pass signal BADPAS remains at "L" level. When the signal Ai is at "H" level, the output of the inverter 54 is also at "H" level. When the signal Ai is at "L" level, the output of the inverter 54 is at "L" level, too. The output of the inverter 54 is supplied to the input of the inverter 56 since the transfer gate 51 is on while the row-address latch signal BRAT stays at "H" level. When the row-address latch signal BRAT falls to "L" level thereafter, the transfer gate 51 is turned off. Therefore, the inverters 56 and 57 mutually connected latch the output of the inverter 56. The transfer gate 51 remains off even if the address-pass signal BADPAS rises from "L" level to "H" level while the row-address latch signal BRAT stays at "L" level. Hence, the output of the inverter 56 remains unchanged.

The NAND circuits 52 and 53, to which the row-address enable signal RAE is input, have their outputs fixed at "H" level as long as the signal RAE stays at "L" level, and the output Ali of the inverter 59 and the output BAli of the inverter 60 are fixed at "" level. The signal RAE rises to "H" level after the output of the inverter 56 is latched. Then, the outputs of the NAND circuits 52 and 53 rise to "H" level or falls to "L" level, depending upon the output level of the inverter 56. The outputs Ali and BAli of the address buffer 32 change to the level determined by the external address Ai supplied to the address buffer 32 when the address signal BADPAS is at "L" level.

The operation of the memory cell array will be described next.

In the standby state, the chip enable signal CEB is at "H", the potentials of word lines WL0 to WL7 are at "H", the potentials of the block selection lines BS0 and BS1 are at "L", the potentials of the plate lines PL1 and PL2 are at "L", the potentials of the bit lines BL and BLB are at "L", and the nodes (e.g., the nodes A and B) in the memory cell group 43 are at "L". The "H" level is set within the range of 2 to 3 V. The bit line precharge potential is ground potential.

Figure 5:
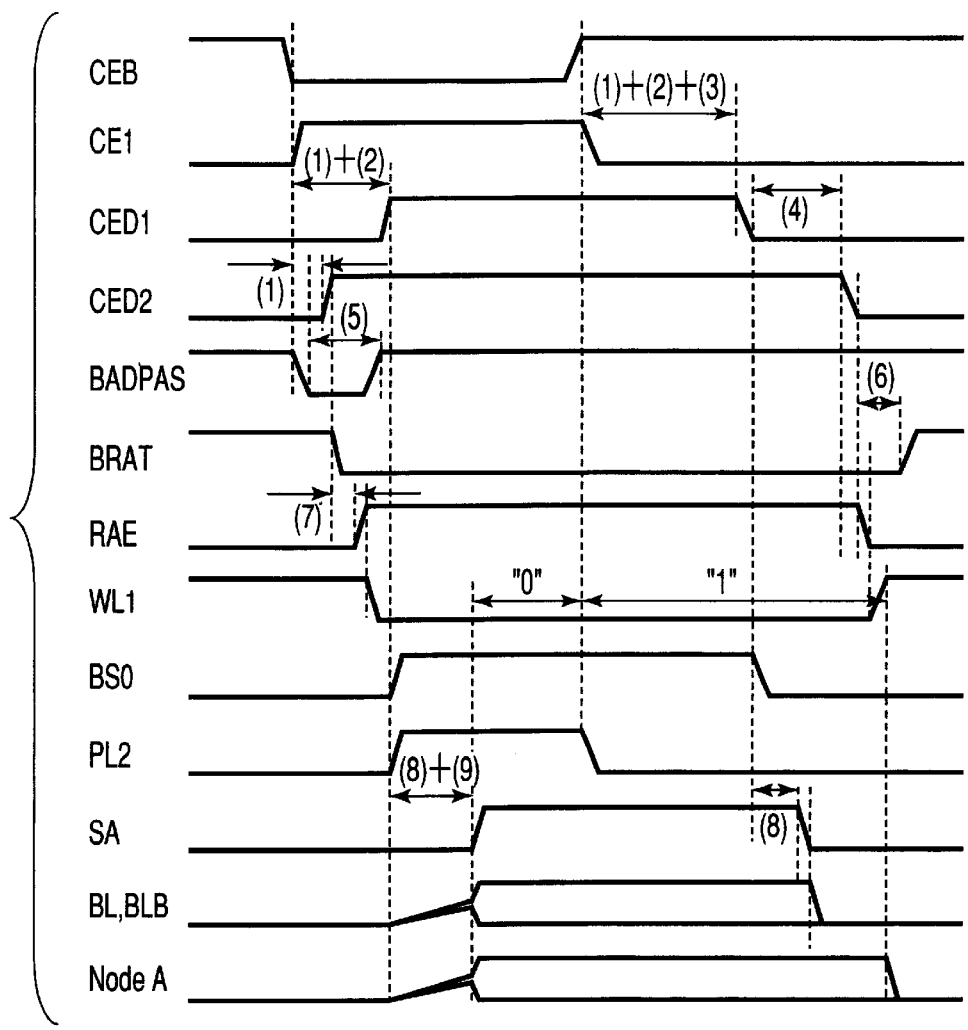
FIG. 5 is a timing chart showing operation according to the first embodiment of the present invention.

In the read mode, the memory device is activated by the external chip enable signal CEB at "L" level, and the memory cell selection signal line WLi and block selection line BSi (i is a natural number) are selected by an external address. FIG. 5 is a timing chart showing the signals in reading data. In FIG. 5, the signal waveforms of the bit lines BL and BLB of a bit line pair are shown in an overlapped manner. A case wherein the memory cell 42 selected by the word line WL1 and block selection line BS0 is connected to the bit line BLB will be described hereinafter.

The signals and nodes shown in FIG. 5 are the same (a as those in the semiconductor memory device shown in FIGS. 1, 2, 3, and 4. Referring to FIG. 5, the signals are synchronized at timings indicated by dotted lines.

When the chip enable signal CEB has changed from "H" level to "L" level, the chip enable signal CE1 output from the chip enable buffer 30 changes from "" level to "H" level. When a predetermined time period has elapsed from the timing in which the chip enable signal CEB has changed from "H" level to "L" level, the external chip enable signal CEB changes from "L" level to "H" level. When the external chip enable signal CEB has changed from "L" level to "H" level, the chip enable signal CE1 changes from "H" level to "L" level.

After the lapse of time (1)+time (2) from the timing when the chip enable signal CE1 changes from "" level to "H" level, the first chip enable delay signal CED1 changes from "L" level to "H" level. After the elapse of times (1) and (2)+time (3) from the timing when the chip enable signal CE1 changes from "H" level to "L" level, the first chip enable delay signal CED1 changes from "H" level to "L" level. The total time (1)+(2)+(3) is about 20 nsec.

After the elapse of time (1) from the timing when the chip enable signal CE1 changes from "L" level to "H" level, the second chip enable delay signal CED2 changes from "L" level to "H" level. After the elapse of time (4) from the timing when the first chip enable delay signal CED1 has changed to "L" level, the second chip enable delay signal CED2 changes from "H" level to "L" level. This time (4) is the delay time by the fourth delay circuit 4 and is about 20 to 30 nsec.

When the chip enable signal CE1 changes from "" level to "H" level, the address pass signal BADPAS simultaneously changes from "H" level to "L" level. After the elapse of time (5) from the change to "" level, the address pass signal BADPAS changes from "L" level to "H" level again.

When the second chip enable delay signal CED2 has changed from "L" level to "H" level, the row address latch signal BRAT changes from "H" level to "L" level. After the elapse of time (6) from the timing when the change of second chip enable delay signal CED2 has changed from "H" level to "L" level, the row address latch signal BRAT changes from "L" level to "H" level.

After the elapse of time (7) from the timing when the second chip enable delay signal CED2 has changed from "L" level to "H" level, the row address enable signal RAE changes from "L" level to "H" level. When the second chip enable delay signal CED2 has changed from "H" level to "L" level, the row address enable signal RAE changes from "H" level to "L" level.

When the row address enable signal RAE has changed from "L" level to "H" level, the word line WL1 is selected by the pre-decoder, and its potential changes from "H" level to "L" level. When the potential of the word line WL1 has changed to "L" level, the cell transistor 42 is selected, i.e., turned off. When the cell transistor 42 has been turned off, one end of the ferroelectric capacitor 41 is disconnected from the other end thereof. When the row address enable signal RAE has changed from "H" level to "L" level, the word line WL1 is unselected, and its potential changes from "L" level to "H" level.

When the first chip enable delay signal CED1 has changed from "L" level to "H" level, the potential of the block selection line BS0 changes from "L" level to "H" level. When the first chip enable delay signal CED1 has changed from "H" level to "L" level, the block selection line BS0 changes from "H" level to "L" level.

When the first chip enable delay signal CED1 has changed from "L" level to "H" level, the potential of the plate line PL2 changes from "L" level to "H" level. When the chip enable signal CE1 changes from "H" level to "L" level, the potential of the plate line PL2 simultaneously changes from "H" level to "L" level.

After the elapse of time (8)+time (9) from the timing when the first chip enable delay signal CED1 has changed from "L" level to "H" level, a sense amplifier control signal SA changes from "L" level to "H" level. After the elapse of time (8) from the timing when the first chip enable delay signal CED1 has changed from "H" level to "L" level, the sense amplifier control signal SA changes from "H" level to "L" level.

When the potential of the plate line PL2 changes from "L" level to "H" level, charges are transferred from the selected memory cell to the bit line BLB, and the bit line BLB is set at a potential corresponding to the data in the memory cell. In addition, when the sense amplifier control signal SA changes from "" level to "H" level, the potential of the bit line BLB is amplified by the sense amplifier and changes to "H" or "L" level in accordance with the data in the memory cell. If the potential of the bit line BLB is at "H" level, it changes to "L" level when the sense amplifier control signal SA has changed from "H" level to "" level.

After the block selection line BS0 has changed from "L" level to "H" level, a node A is connected to the bit line BLB. When the plate line PL2 changes from "L" level to "H" level, the bit line BLB changes to a bit line potential corresponding to the data in the memory cell, and the node A also changes to the bit line potential. When the sense amplifier control signal SA changes from "L" level to "H" level, the node A changes to "H" level or "L" level, like the bit line. When the block selection line BS0 changes from "H" level to "L" level and then the potential of the word line WL1 changes from "L" level to "H" level, the cell transistor 40 is turned on, and the node A and node B (FIG. 3) are short-circuited. At this time, all the cell transistors of the memory cells are ON, and the potential of the nodes A and B equals the potential of the plate line PL2.

As shown in FIG. 5, since the delay time (4) by the delay circuit 4 (FIG. 4) is additionally set, the "1" rewrite time of the word line WL1 is set to be longer than that in the conventional operation shown in FIG. 30. That is, the time (4) is added to the time (1)+(2)+(3), and the total time can be as long as 40 to 50 nsec. Even when the delay time is prolonged, the block selection signal BS0 is already at "L" level during the time (4). Hence, the block selection transistor 44 is OFF, and the bit line BLB and the memory cell group 43 are disconnected by the selection transistor 44. For this reason, since the ground potential or the like can be set by bit line precharge to prepare for the next operation, the operation speed is not reduced.

The external chip enable signal CEB is set at "L" level for about 50 to 100 nsec. A read will be described here assuming that a dummy cell for generating an intermediate potential between the "1" and "0" signal lines is connected to the bit line BL side so as to generate a reference voltage.

After the chip enable signal CE1 has changed from "L" level to "H" level, the potential of the word line WL1 changes from "H" level to "L" level, and then the block selection signal BS0 changes from "L" level to "H" level.

After that, the plate line PL2 changes from "" level to "H" level. The information in the ferroelectric capacitor 41 of the memory cell 42 is transferred to the bit line BLB and amplified by the sense amplifier and I/O circuit 39. The bit lines BL and BLB are set in complementary states, i.e., "H" and "L" or "L" and "H". When the memory cell 42 stores "1" data, the bit line BLB is set at "H" level and the bit line BL is set at "L" level. When the memory cell stores "0" data, the bit line BLB is set at "L" level and the bit line BL is set at "H" level. The bit line potential is amplified by the sense amplifier and I/O circuit 39, and the sense result is output from the input/output buffer 34, thereby reading the "1" or "0" data.

For the read from the ferroelectric memory cell, polarization inversion occurs in reading "1" data but not in reading "0" data.

In reading "1" data, since the polarization direction of the ferroelectric capacitor is broken, a write must be executed after the read.

A rewrite of "0" data after the read is executed while keeping the plate line PL2 set at "H" and setting the bit line BLB at "L", as shown in FIG. 5.

In reading "1" data, a rewrite of "1" data is executed while setting the bit line BLB at "H" after the plate line PL2 has changed to "L".

In the TC parallel unit series connection type ferroelectric memory as shown in FIG. 3, when a read is ended with the external chip enable signal CEB set at "H" level, all the word lines WL are set at "H" level, i.e., set in the unselected state. Since the selected word line WL1 is set at "H" level, the two terminals of the ferroelectric capacitor are short-circuited to eliminate the potential difference across the ferroelectric capacitor, and the write state is ended.

In this embodiment, to ensure a sufficient "1" data write time for the rewrite in the ferroelectric capacitor with polarization inversion, the word line WL is kept selected for a predetermined time after the plate line PL has changed from "H" level to "L" level, thereby applying a voltage to the ferroelectric capacitor in the memory cell even after the write.

After "0" data is written by setting the plate line PL at "H" level, the potential of the plate line PL is set at "L" level to start writing "1" data. Immediately after that, the block selection line BS is set at "L" level to disconnect the memory cell group 43 from the bit line BLB. After the potential of the plate line PL has changed to "L" level, the selected word line WL1 is kept in the selected state ("L" state) for a predetermined time. With this operation, the potential of the bit line BLB is continuously applied to the node A and the potential of the plate line PL ("L" level) is continuously applied to the node B. The write voltage is applied to the ferroelectric capacitor 41 of the memory cell 42. During this time, the ferroelectric capacitor 41 can be kept in the "1" data write state. For this reason, the write can be sufficiently done, and the data reliability can be ensured. After that, the write state is ended as the selected word line WL1 is set at "H" level, and the standby state is set.

In writing data, not read information but information according to external input is written. The write operation is performed at the same timing as that of the rewrite after the read. That is, the selected word line WLi is kept selected for a predetermined time after the potential of the plate line PL changes to "L" level. With this operation, the voltage can be continuously applied to the ferroelectric capacitor 41 of the memory cell 42 even after the write, and the "1" data can be sufficiently written.

Figure 6:
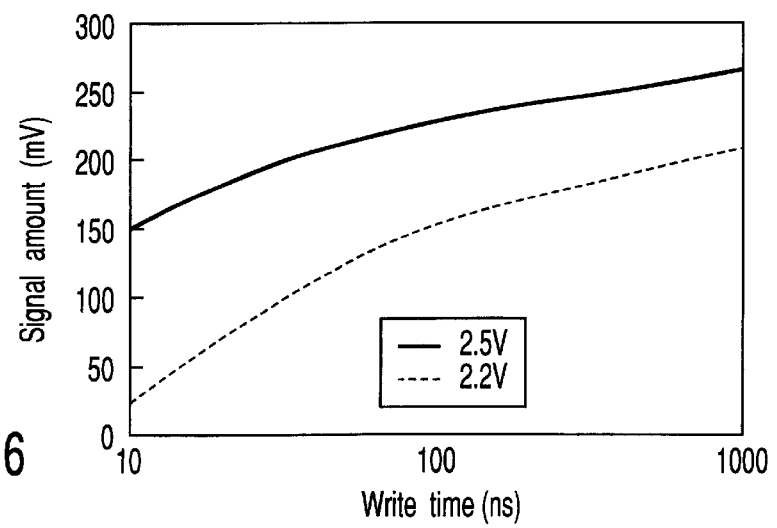
FIG. 6 is a graph showing the write voltage dependence of the read signal amount of a ferroelectric memory.

FIG. 6 is a graph showing the relationship between the write time and the signal amount in the read of the ferroelectric memory cell of this embodiment of the present invention. FIG. 6 shows a result of measurement at room temperature using a 0.22-$\mu$m thick PZT film. The memory cell drive voltage was set to 2.2 V and 2.5 V.

When the memory cell drive voltage is set to 2.5 V using a power supply voltage as high as 2.5 V, a signal amount of 180 mV is obtained for a conventional write time of 20 nsec. In the first embodiment, since the write time is prolonged to 50 nsec, the signal amount is 210 mV, i.e., larger than the prior art by 17%.

When the memory cell drive voltage is set to 2.2 V using a power supply voltage as low as 2.2 V, a signal amount of 70 mV is obtained for the conventional write time of 20 nsec. In the first embodiment, the write time is 50 nsec, and the signal amount is 120 mV, i.e., larger than the prior art by 70%. When the memory cell drive voltage is low, a signal amount larger than the prior art can be ensured using this embodiment. Especially, in a semiconductor memory device operated at a low voltage, the memory cell characteristic improving effect of this embodiment becomes conspicuous.

According to this embodiment of the present invention, in a TC parallel unit series connection type ferroelectric memory, a delay time is set after the plate line PL has changed "L" level until the word line WL as a memory cell selection signal line changes to "H" level (the selected state is canceled), thereby leaving the write voltage across the ferroelectric capacitor. With this arrangement, a sufficient data write time can be obtained. That is, using the TC parallel unit series connection type ferroelectric memory, the write voltage is continuously applied to the ferroelectric capacitor of the memory cell even after the end of write operation. Hence, the data can be sufficiently written, and the cell data holding characteristic can be improved.

SECOND EMBODIMENT

The overall device arrangement, cell array structure, and address buffer arrangement of the second embodiment are the same as those of the first embodiment shown in FIGS. 2, 3, and 4. The read method is the same as in the first embodiment, and the rewrite timing is different.

Figure 7:
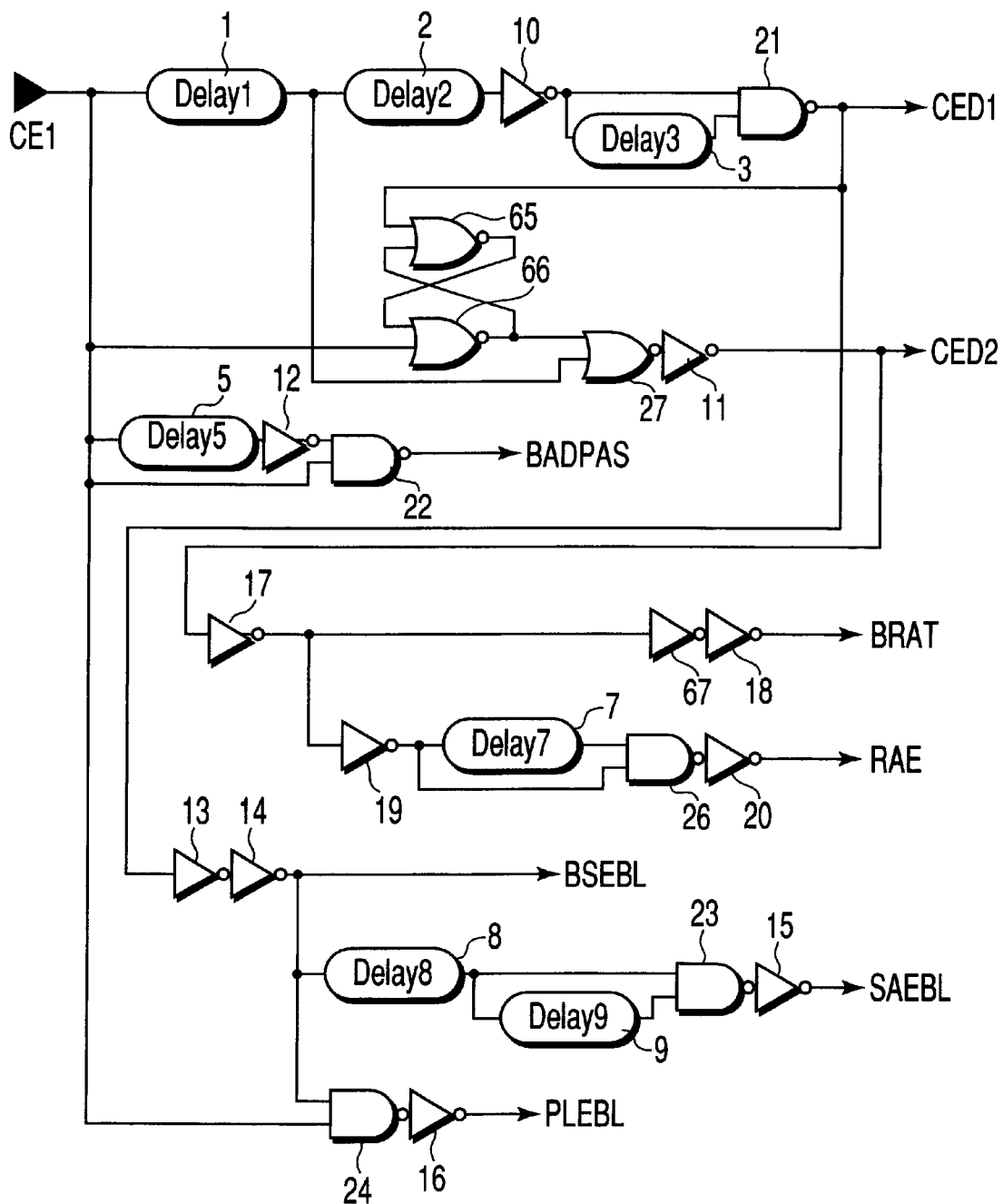
FIG. 7 is a view showing the arrangement of a control circuit according to the second embodiment of the present invention.

As shown in FIG. 7, the arrangement of a control circuit of this embodiment is almost the same as in the first embodiment shown in FIG. 1. That is, in place of the fourth delay circuit 4 shown in FIG. 1, a flip-flop circuit formed from second and third NOR circuits 65 and 66 is added. A first chip enable delay signal CED1 and the output from the third NOR circuit 66 are input to the second NOR circuit 65. The output from the second NOR circuit 65 and a chip enable signal CE1 are input to the third NOR circuit 66. The output from the third NOR circuit 66 and the output from a first delay circuit 1, which is the delayed signal of the chip enable signal CE1, are input to a first NOR circuit 27. The output from the first NOR circuit 27 is output through a second inverter 11 as a second chip enable delay signal CED2.

In this control circuit, a 12th inverter 67 is inserted between a seventh inverter 17 and an eighth inverter 18 in place of a sixth delay circuit 6 and fifth NAND circuit 26 in the control circuit of the first embodiment. The eighth inverter 18 outputs a row address latch signal BRAT.

Figure 8:
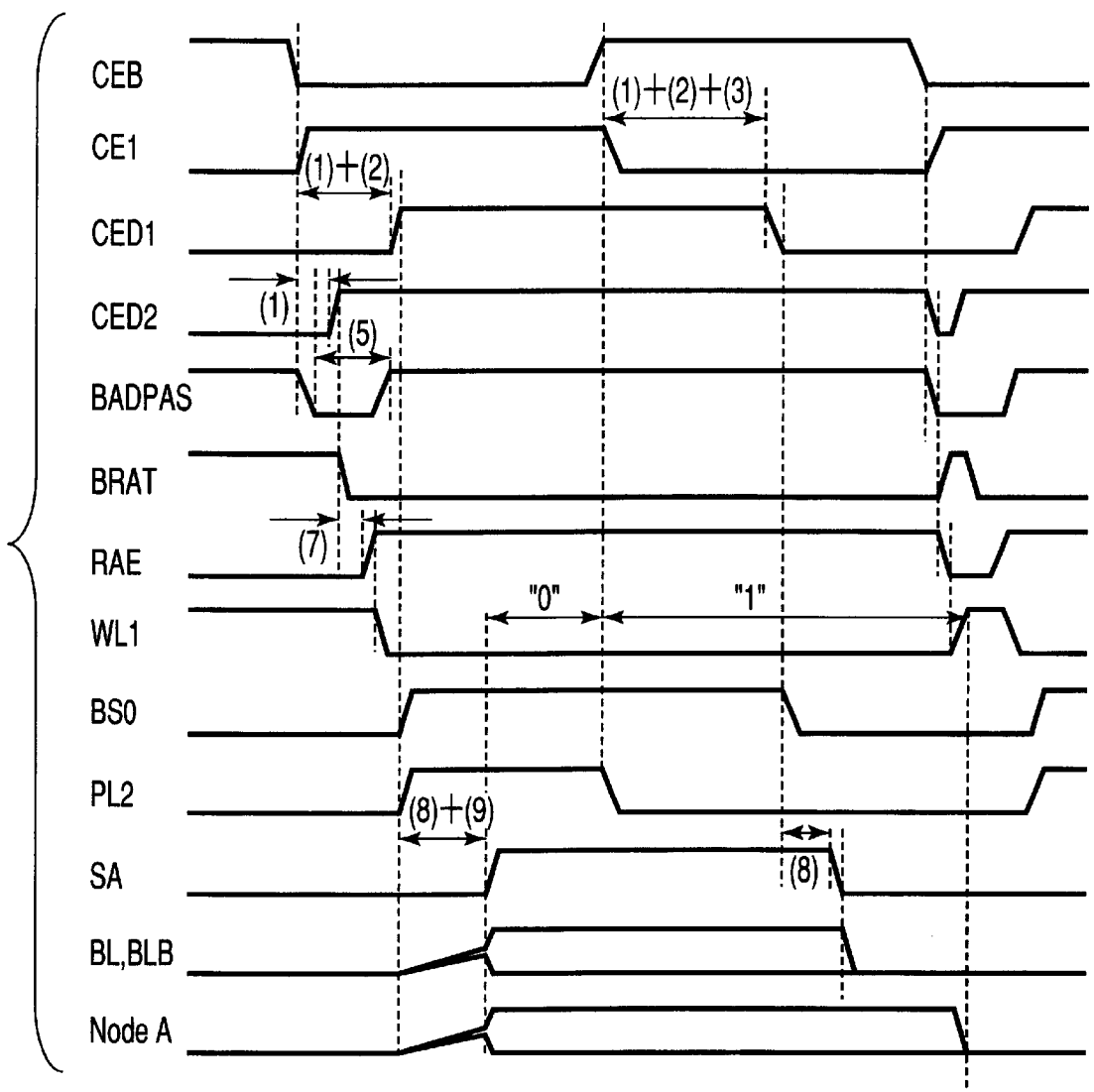
FIG. 8 is a timing chart showing operation according to the second embodiment of the present invention.

FIG. 8 is a timing chart showing main signals according to the second embodiment and their waveforms in reading from a node. Referring to FIG. 8, the signals are synchronized at timings indicated by dotted lines.

As shown in FIG. 8, the timings of the first change of an external chip enable signal CEB from "H" level to "L" level to the change of a bit line BLB from "1" or "0" level to "0" level are the same as those in the first embodiment.

In the second embodiment, when the external chip enable signal CEB has changed from "H" level to "" level again, the chip enable signal CE1 changes from "L" level to "H" level, and the second chip enable delay signal CED2 and address pass signal BADPAS change from "H" level to "L" level.

When the second chip enable delay signal CED2 and address pass signal BADPAS have changed from "H" level to "L" level, the row address latch signal BRAT changes from "L" level to "H" level, and a row address enable signal RAE changes from "H" level to "L" level.

When the row address enable signal RAE has changed from "H" level to "L" level, the decoder is set in the unselected state and the potential of the word line WL1 changes from "L" level to "H" level.

When the potential of the word line WL1 has changed from "L" level to "H" level, a node A changes to "0" level.

As shown in FIG. 8, a rewrite after the read is executed while keeping a plate line PL at "H" and setting a bit line BLB at "L".

For a "1" data rewrite, after the plate line PL2 changes to "L" level, the selected word line WL1 is set in the unselected state at the trailing edge of the external chip enable signal CEB. With this operation, "1" data can be written until the start of the next read cycle. Hence, the "1" data can be sufficiently written.

For a data write as well, after the potential of the plate line PL2 changes to "L" level, the selected word line WL1 is set in the unselected state at the trailing edge of the external chip enable signal CEB.

In the second embodiment as well, the same effect as in the first embodiment can be obtained.

THIRD EMBODIMENT

The overall device arrangement, cell array structure, and address buffer arrangement of the third embodiment are the same as those of the first embodiment shown in FIGS. 2, 3, and 4.

In this embodiment, the voltage of a plate line PL is fixed to a voltage (e.g., ½ of the power supply voltage). The bit line precharge potential is ½ of the power supply voltage. That is, the read method is the same as in the first embodiment, and the rewrite timing is also the same as in the first embodiment. The voltage of the plate line differs from that of the first embodiment and is fixed to a voltage (e.g., ½ of the power supply voltage).

Figure 9:
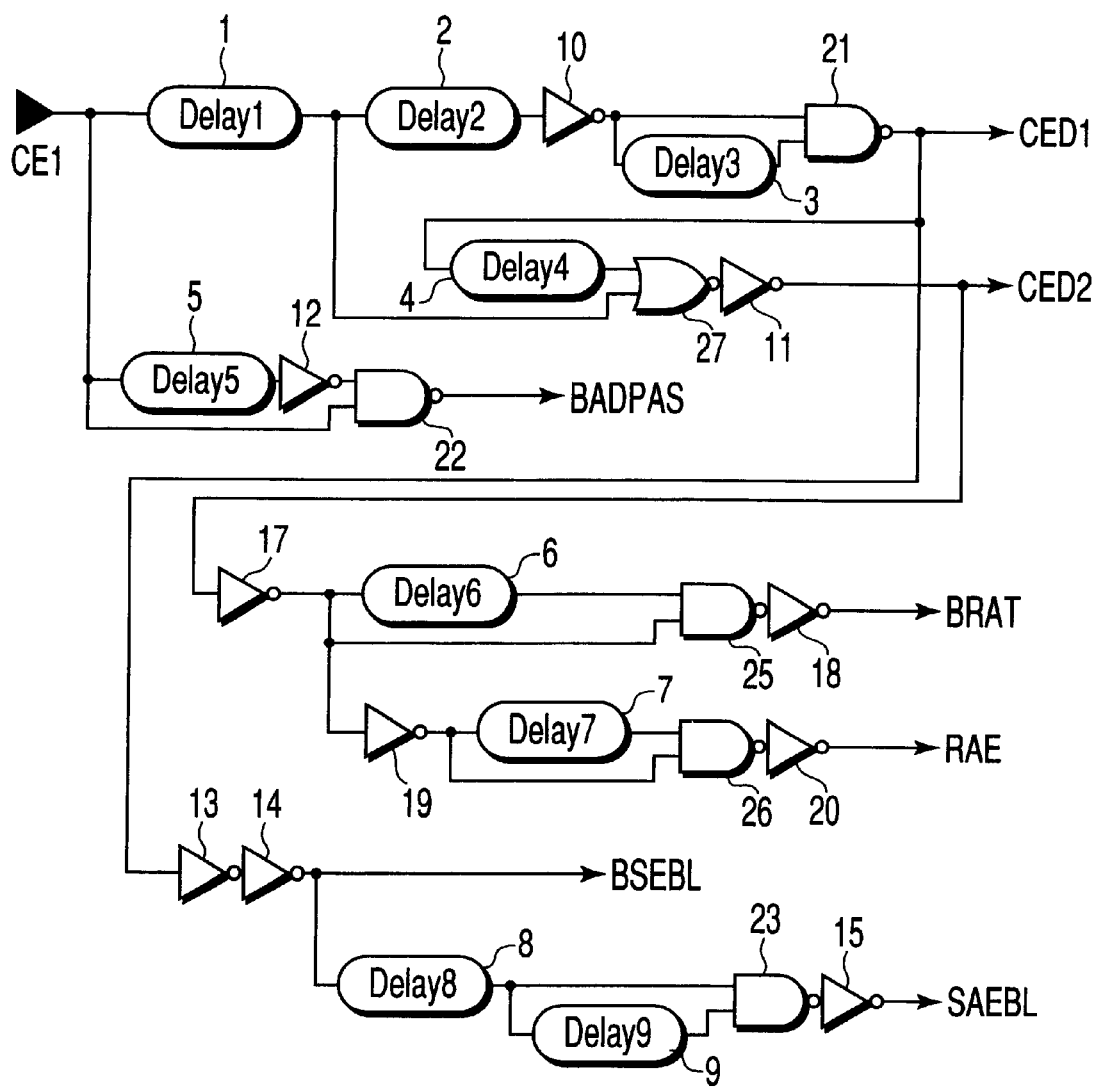
FIG. 9 is a view showing the arrangement of a control circuit according to the third embodiment of the present invention.

As shown in FIG. 9, the arrangement of a control circuit of this embodiment is almost the same as in the first embodiment shown in FIG. 1. However, a fourth NAND circuit 24 and seventh inverter 16 in FIG. 1 are omitted, so a plate line enable signal PLEBL is not generated. In this embodiment, since the plate line PL need not be clock-controlled, the plate line enable signal PLEBL is unnecessary.

Figure 10:
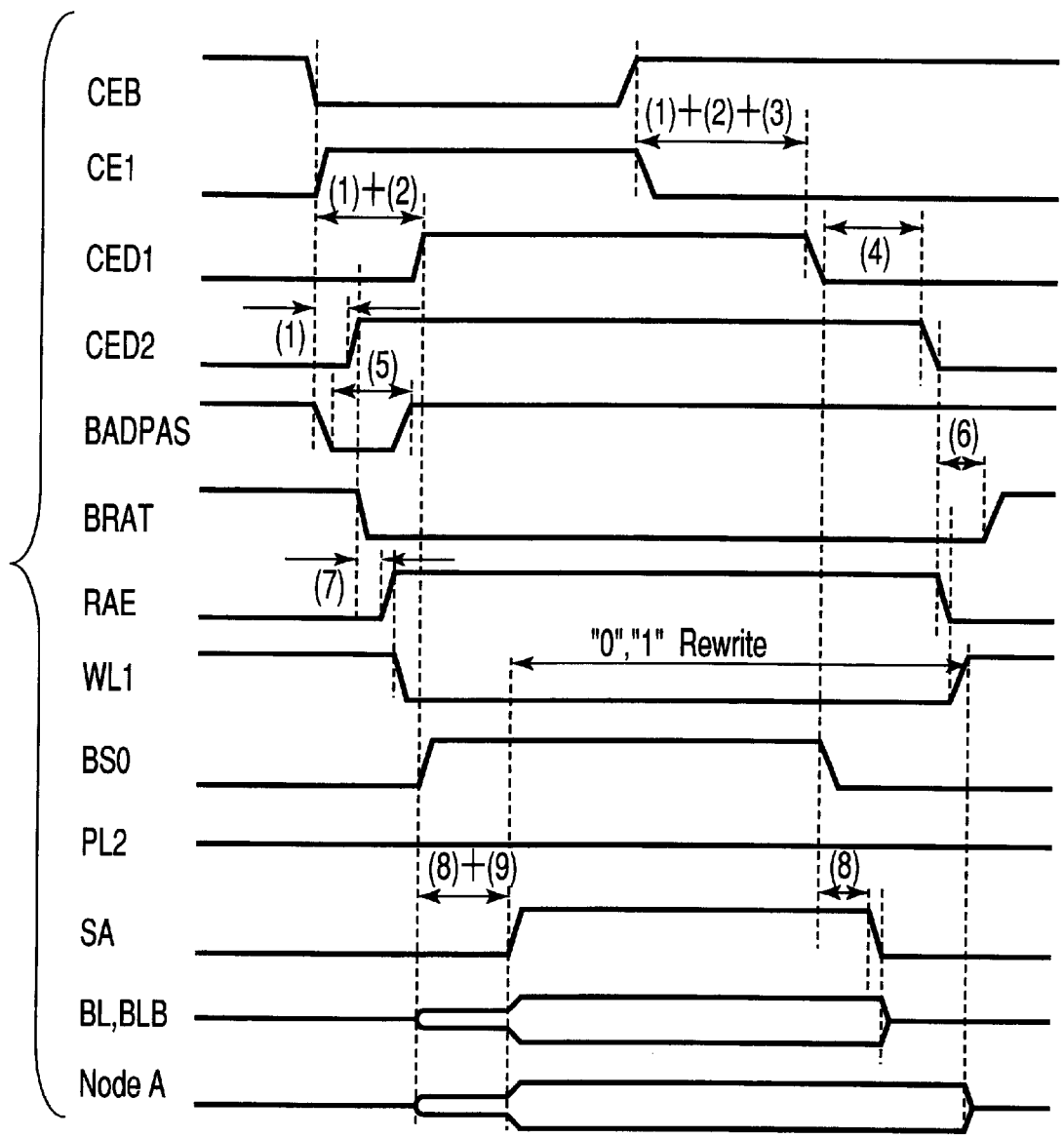
FIG. 10 is a timing chart showing operation according to the third embodiment of the present invention.

FIG. 10 is a timing chart showing main signals according to the third embodiment and their waveforms in reading from a node. Referring to FIG. 10, the signals are synchronized at timings indicated by dotted lines.

As shown in FIG. 10, the potential of a bit line BLB and that of a node A are set to ½ of the power supply voltage in the initial state. The timings of the first change of an external chip enable signal CEB from "H" level to "L" level to the change of the bit line BLB from ½ level of the power supply voltage to "1" or "0" level and additionally the change from "1" or "0" level to ½ level of the power supply voltage are the same as those in the first embodiment.

As shown in FIG. 10, the potentials of the bit line BLB and node A are slightly higher in a "1" data read because the memory cell is connected to the bit line when a block selection signal BS0 changes from "L" level to "H" level. The potentials becomes slightly lower in a "0" data read. After the elapse of time (8) +time (9), when a sense amplifier control signal SA changes from "L" level to "H" level, the potentials of the bit line BLB and node A simultaneously change to "H" level in the "1" data read or to "L" level in the "0" data read.

After that, the potentials of the bit line BLB and node A change to ½ of the power supply voltage at the same timing as in the first embodiment. The third embodiment is different from the first embodiment in that the potentials of the bit line BLB and node A change not to "L" level but to ½ of the power supply voltage.

In the standby state, the external chip enable signal CEB is at "H", the potentials of word lines WL0 to WL7 are at "H", block selection signals BS0 and BS1 are at "L", the potentials of plate lines PL1 and PL2 are at "½ of the power supply voltage", the potentials of the bit lines BL and BLB are at "½ of the power supply voltage", and the nodes (e.g., the nodes A and B) in the memory cell group are at "½ of the power supply voltage". In a read, the memory cell is activated by the external chip enable signal CEB at "L" level, and a word line WLi and block selection line BSi selected by an external address are selected. In this case, a memory cell 42 is selected by the word line WL1 and block selection line BS0 and connected to the bit line BLB.

In this embodiment, no reference cell is used, and whether cell information is "1" or "0" is determined depending on whether the bit line potential is higher or lower than ½ of the power supply voltage.

A rewrite after the read is done by applying the bit line potential and plate line potential to the two terminals of the ferroelectric capacitor after sensing the bit line. After the bit line potential is amplified by a sense amplifier, the selected word line WL is kept selected even after the block selection signal BS changes to "L" level. With this operation, the write voltage is continuously applied to a ferroelectric capacitor 41 until the word line is set in the unselected state and the potentials at the two terminals of the ferroelectric capacitor 41 in the memory cell 42 are short-circuited.

In this embodiment, both "0" data and "1" data are written at this timing. As shown in FIG. 10, for a "0" data write, the bit line potential after sensing, i.e., a potential GND (e.g., 0 V) is applied to the node A, and the potential of the plate line PL, i.e., ½ of the power supply voltage, 1.6 V, is applied to the node B. With this operation, a "0" data write state is set. For a "1" data write, the bit line potential after sensing, i.e., the power supply voltage (e.g., 3.3 v) is applied to the node A, and the potential of the plate line PL, i.e., ½ of the power supply voltage, 1.6 V, is applied to the node B. With this operation, a "1" data write state is set.

Since the selected word line WL is kept selected during a predetermined time even after the block selection signal BS is set in the unselected state (L level), both "0" and "1" data can be sufficiently written.

If the characteristics of a ferroelectric film allow sufficient data write and holding at ½ of the power supply voltage, this embodiment is preferable because no reference cell is used, and the read and write operations can be performed without clock-controlling the plate potential.

In the third embodiment as well, the same effect as in the first embodiment can be obtained.

FOURTH EMBODIMENT

The overall device arrangement, cell array structure, and address buffer arrangement of the fourth embodiment are the same as those of the first embodiment shown in FIGS. 2, 3, and 4. The read method is the same as in the first embodiment, and the rewrite timing is different from that of the first embodiment.

The fourth embodiment is a combination of the second and third embodiments.

In this embodiment, the rewrite timing is the same as in the second embodiment, and the voltage of the plate line PL is the same as in the third embodiment and is fixed to a voltage (e.g., ½ of the power supply voltage). Also, the bit line precharge potential is ½ of the power supply voltage.

Figure 11:
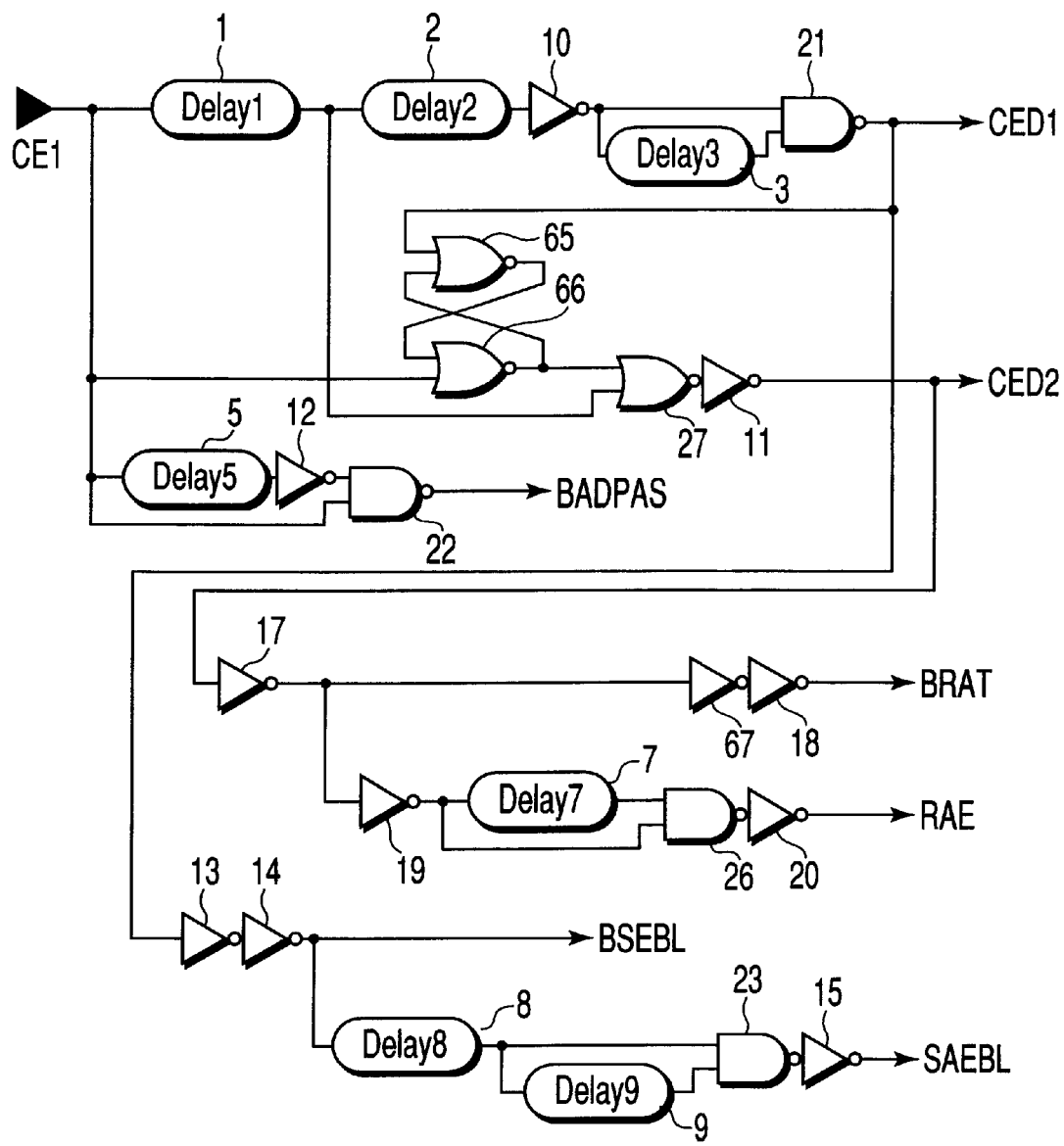
FIG. 11 is a view showing the arrangement of a control circuit according to the fourth embodiment of the present invention.

As shown in FIG. 11, the arrangement of a control circuit of this embodiment is almost the same as in the second embodiment shown in FIG. 7. However, a fourth NAND circuit 24 and seventh inverter 16 in FIG. 7 are omitted, so a plate line enable signal PLEBL is not .74 generated. In this embodiment, since the plate line PL need not be clock-controlled, the plate line enable signal PLEBL is unnecessary.

Figure 12:
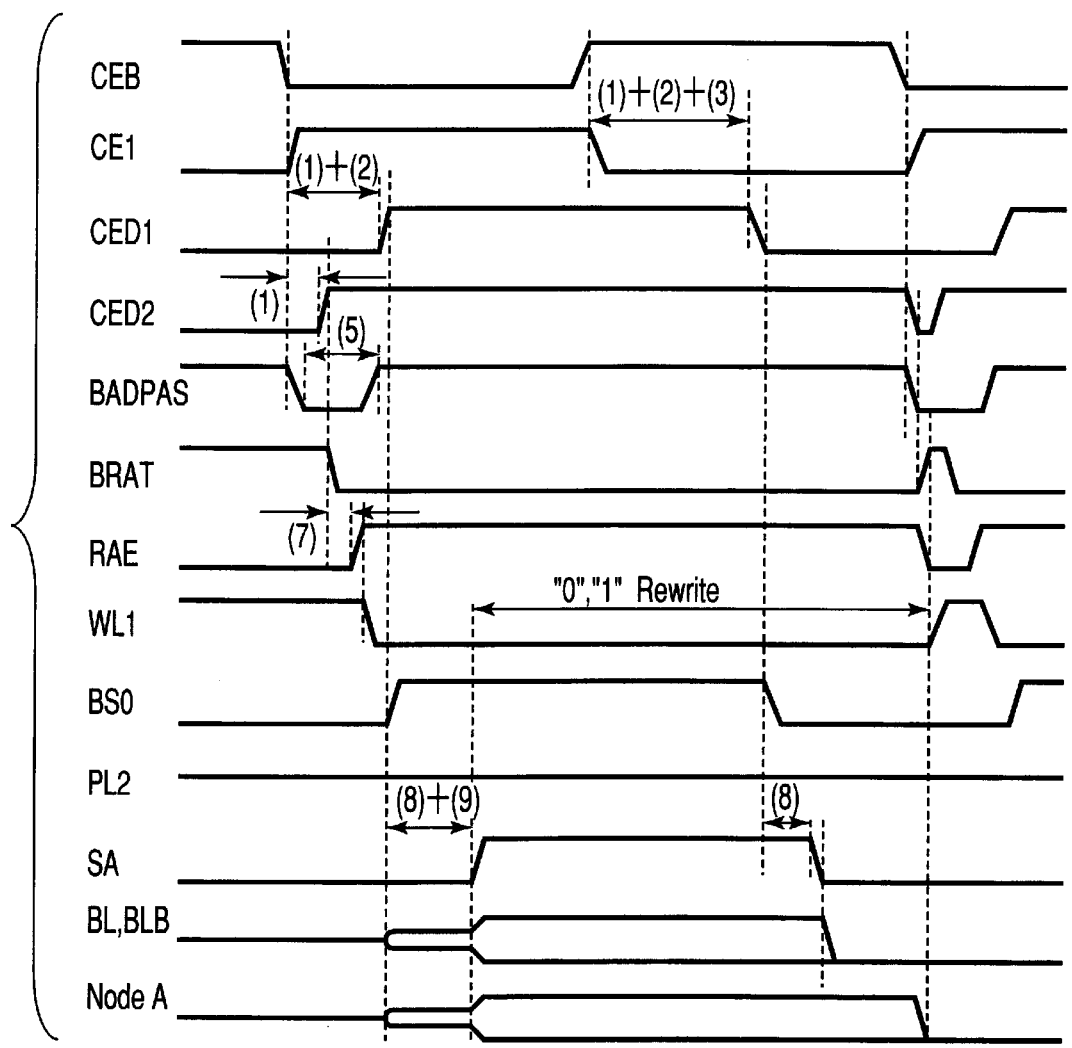
FIG. 12 is a timing chart showing operation according to the fourth embodiment of the present invention.

FIG. 12 is a timing chart showing main signals according to the fourth embodiment and their waveforms in reading from a node. Referring to FIG. 12, the signals are synchronized at timings indicated by dotted lines.

As shown in FIG. 12, the potential of a bit line BLB and that of a node A are set to ½ of the power supply voltage in the initial state. The timings of the first change of an external chip enable signal CEB from "H" level to "L" level to the change of the bit line BLB from ½ level of the power supply voltage to "1" or "Off level and additionally the change from "1" or "0" level to ½ level of the power supply voltage are the same as those in the second embodiment.

As shown in FIG. 12, the potentials of the bit line BLB and node A are slightly higher in a "1" data read and slightly lower in a "0" data read. After the elapse of time (8)+time (9), when a sense amplifier control signal SA changes from "L" level to "H" level, the potentials simultaneously change to "H" level in the "1" data read or to "L" level in the "0" data read. After that, the potentials of the bit line BLB and node A change to ½ of the power supply voltage at the same timing as in the third embodiment.

In the standby state, the external chip enable signal CEB is at "H", the potentials of word lines WL0 to WL7 are at "H", block selection signals BS0 and BS1 are at "L", the potentials of plate lines PL1 and PL2 are at "½ of the power supply voltage", the potentials of the bit lines BL and BLB are at "½ of the power supply voltage", and the nodes (e.g., the nodes A and B) in the memory cell group are at "½ of the power supply voltage". In a read, the memory cell is activated by the chip enable signal CEB at "L" level, and a word line WLi and block selection line BSi selected by an external address are selected. In this case, a memory cell 42 is selected by the word line WL1 and block selection line BS0 and connected to the bit line BLB.

In this embodiment, no reference cell is used, and whether cell information is "1" or "0" is determined depending on whether the bit line potential is higher or lower than ½ of the power supply voltage.

A rewrite after the read is done by applying the bit line potential and plate line potential to the two terminals of the ferroelectric capacitor after sensing the bit line. After the bit line potential is amplified by a sense amplifier, the selected word line WL is kept selected even after the block selection signal BS changes to "L" level. With this operation, the write voltage is applied to a ferroelectric capacitor 41 until the word line is set in the unselected state and the potentials at the two terminals of the ferroelectric capacitor 41 in the memory cell 42 are short-circuited.

In this embodiment, both "0" data and "1" data are written at this timing. As shown in FIG. 12, for a "0" data write, the bit line potential after sensing, i.e., a potential GND (e.g., 0 V) is applied to the node A, and the potential of the plate line PL, i.e., ½ of the power supply voltage, 1.6 V, is applied to the node B. With this operation, a "0" data write state is set.

For a "1" data write, the bit line potential after sensing, i.e., the power supply voltage (e.g., 3.3 V) is applied to the node A, and the potential of the plate line PL, i.e., ½ of the power supply voltage, 1.6 V, is applied to the node B. With this operation, a "1" data write state is set.

Since the selected word line WL is kept selected till the start of the next cycle in which the external chip enable signal CEB falls even after the block selection signal BS is set in the unselected state (L level), both "0" and "1" data can be sufficiently written.

Also, in external data write time, "0" and "1" data are written in the similar timing to that of the rewrite in the read time, with the result that both "0" and "1" data can be sufficiently written.

If the characteristics of a ferroelectric film allow sufficient data write and holding at ½ of the power supply voltage, this embodiment is preferable because no reference cell is used, and the read and write operations can be performed without clock-controlling the plate potential.

In the fourth embodiment as well, the same effect as in the first embodiment can be obtained.

FIFTH EMBODIMENT

The address buffer arrangement of the fifth embodiment is the same as that of the first embodiment shown in FIG. 4. The read method is the same as in the first embodiment. A switch drive circuit 70 for connecting or disconnecting a memory cell to or from a plate line is added and the drive method to release the selection of the word line is different from the first embodiment.

Figure 13:
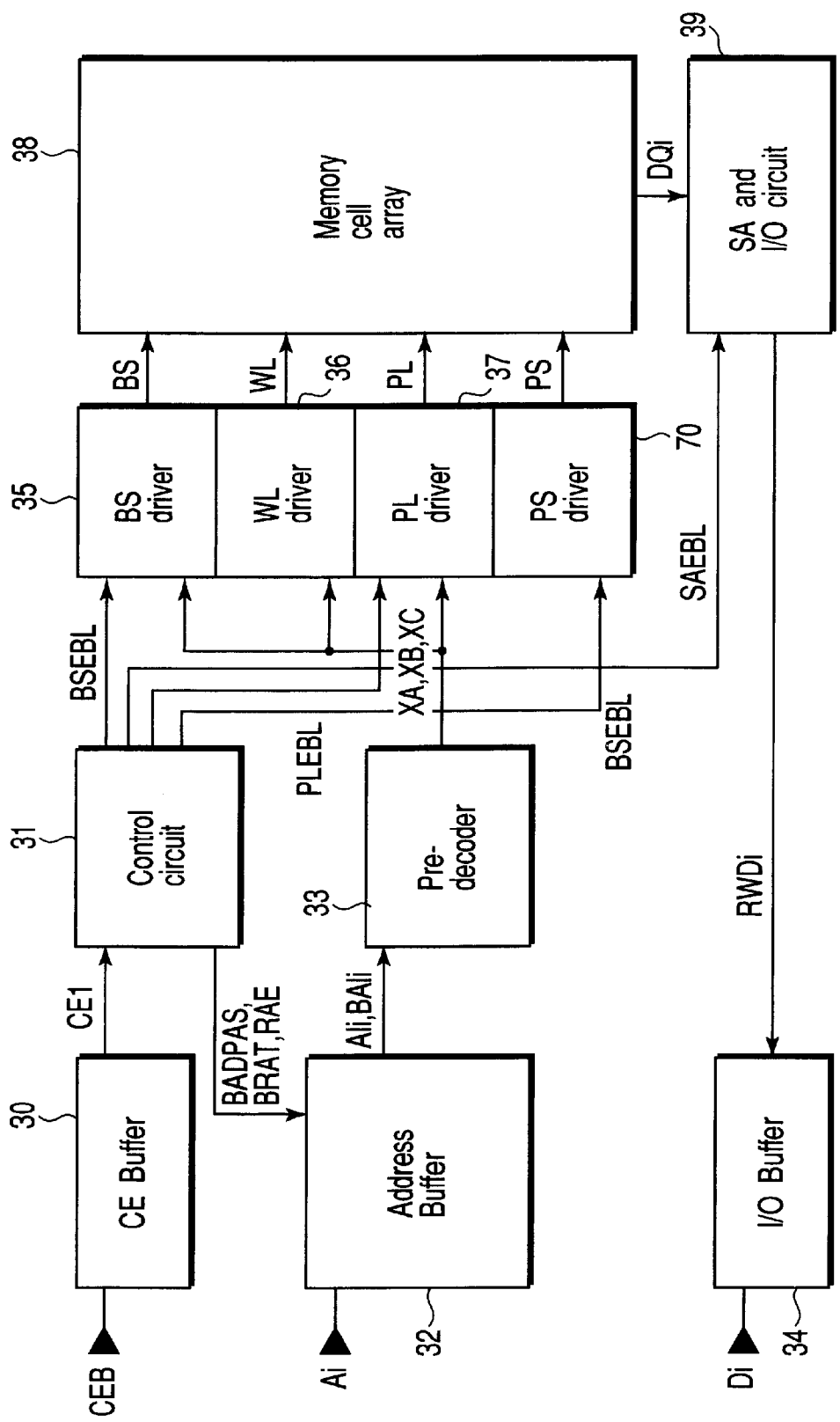
FIG. 13 is a block diagram showing the arrangement of a semiconductor memory device according to the fifth to eighth embodiments of the present invention.

FIG. 13 is a block diagram showing the overall arrangement of the fifth embodiment, which is the almost the same as in the first embodiment. The fifth embodiment is different from the first embodiment in that a signal, i.e. , plate line connection enable signal PSEBL is generated from the control circuit, and a switch drive circuit 70 for connecting or disconnecting a memory cell to or from a plate line is added.

Figure 14:
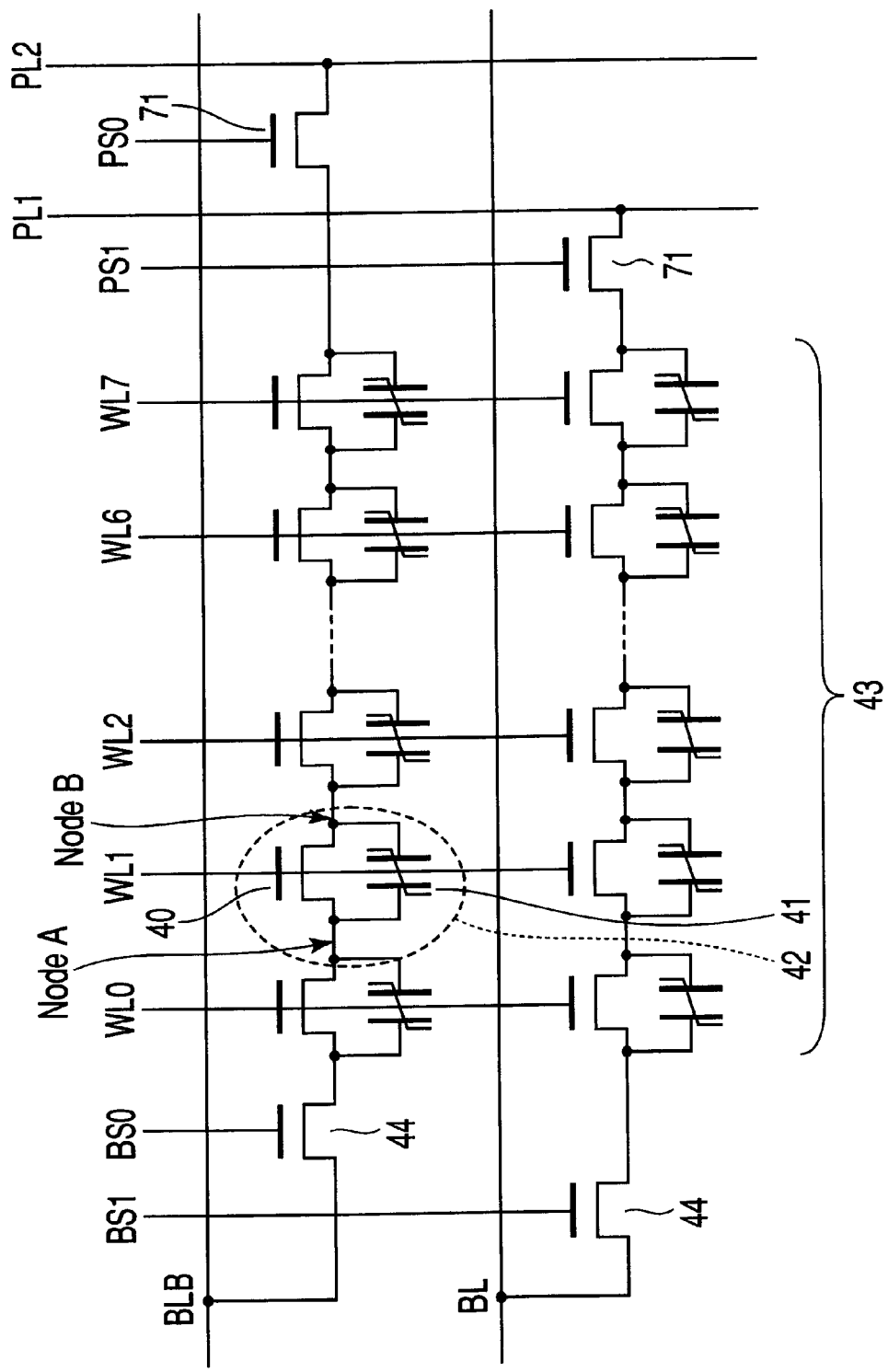
FIG. 14 is a circuit diagram showing the structure of a memory cell array according to the fifth to eighth embodiments of the present invention.

FIG. 14 is a circuit diagram showing the structure of a memory cell array according to the fifth embodiment. Unlike the memory cell array of the first embodiment shown in FIG. 3, plate line selection transistors 71 are inserted between memory cell groups 43 and plate lines PL1 and PL2. The plate line selection transistors 71 have gates for receiving plate line connection signals PS0 and PS1.

Figure 15:
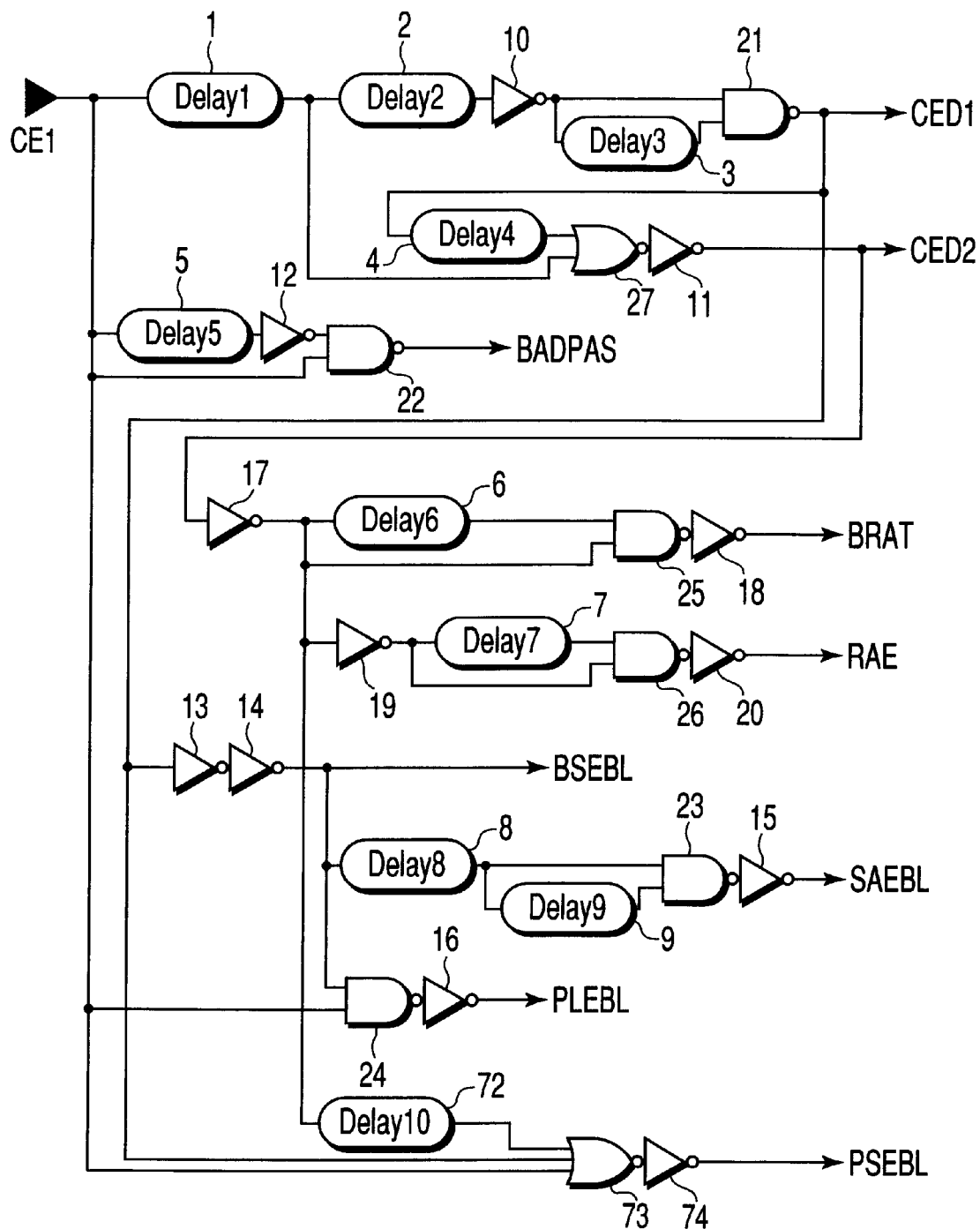
FIG. 15 is a view showing the arrangement of a control circuit according to the fifth embodiment of the present invention.

FIG. 15 is a view showing the arrangement of the control circuit according to the fifth embodiment, which is almost the same as in the first embodiment. Unlike the first embodiment, a 10th delay circuit 72 for receiving the output signal for an eighth inverter 17 is provided, and a second NOR circuit 73 for receiving the output signal from the 10th delay circuit 72, a first chip enable delay signal CED1, and a chip enable signal CE1 is added. In addition, a 12th inverter 74 for receiving the output signal from the second NOR circuit 73 is also added. The 12th inverter 74 outputs the plate line connection enable signal PSEBL.

Figure 16:
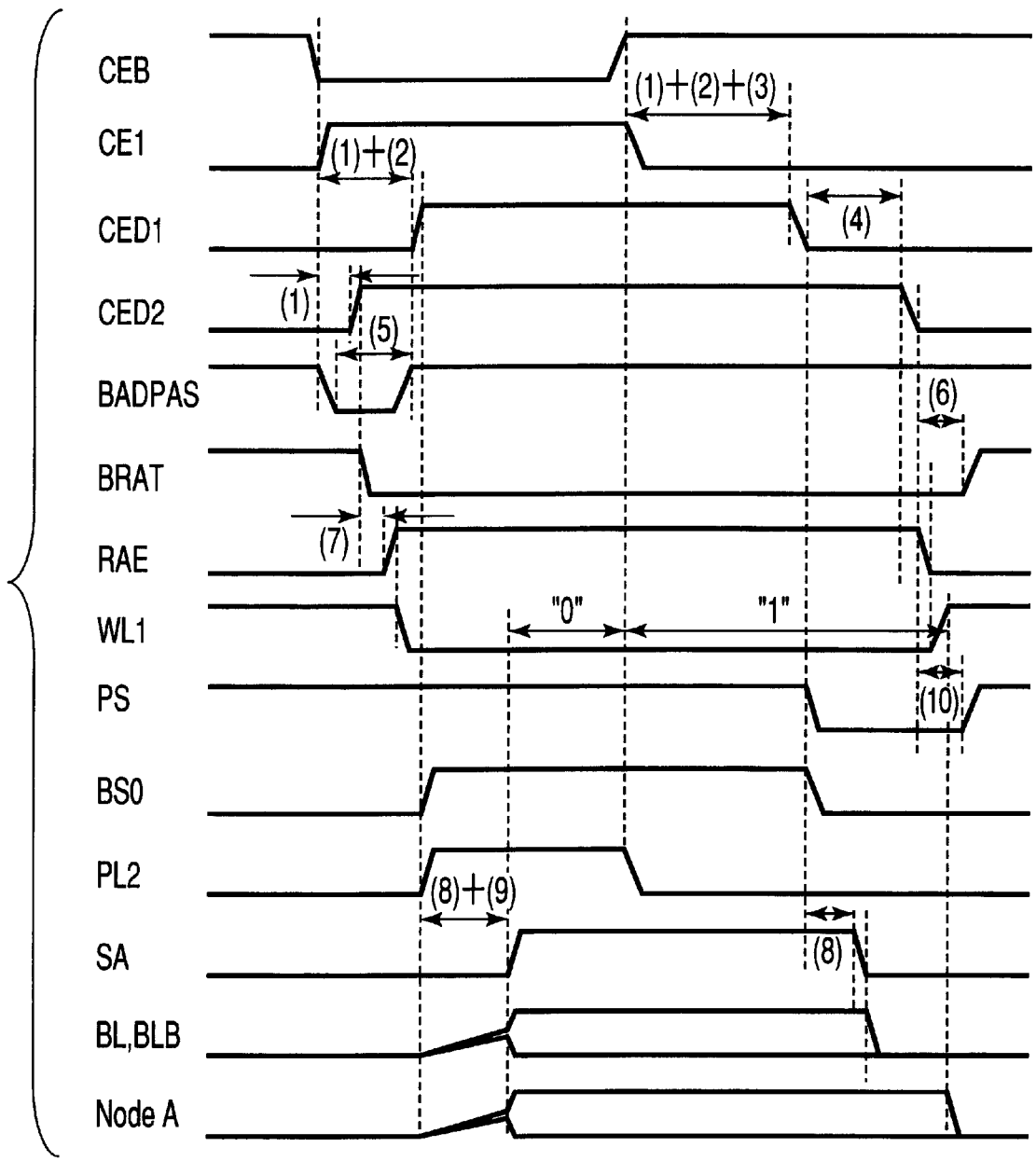
FIG. 16 is a timing chart showing operation according to the fifth embodiment of the present invention.

FIG. 16 is a timing chart showing main signals and signals at the node in the fifth embodiment, which is almost the same as in the first embodiment. Referring to FIG. 16, the signals are synchronized at timings indicated by dotted lines.

Unlike the first embodiment, the waveform of the plate line connection signal PS is added. The plate line connection signal PS is set at "H" level from read operation to the midway of rewrite operation. When the first chip enable delay signal CED1 has changed from "H" level to "L" level, the plate line connection signal PS changes from "H" level to "L" level. Then, after the elapse of time (10) from the timing when the second chip enable delay signal CED2 has changed from "H" level to "L" level, the plate line connection signal PS changes from "L" level to "H" level.

In the standby state in this fifth embodiment , an external chip enable signal CEB is at "H", word lines WL0 to WL7 are at "H", block selection signals BS0 and BS1 are at "L", plate lines PL1 and PL2 are at "L", bit lines BL and BLB are at "L", the plate line connection signals PS0 and PS1 are at "H", and nodes (e.g., nodes A and B) in the memory cell group are at "L".

In a read, the memory cell is activated by the external chip enable signal CEB at "L" level. The operation after the word line changes to "L" level until the block line selection signal BS changes to "H" level and sense operation is performed is the same as in the first embodiment. During this time, the plate line connection signal PS is at "H", a selection transistor 44 is ON, and the plate line PL and memory cell group 43 are connected.

Rewrite in the fifth embodiment is similar to that in the first embodiment, and "0" data is rewritten in the cells connected to an "L" level bit line when the plate line PL2 is at "H" level. After "0" data is written, the potential of the plate line PL is set at "L" level to rewrite "1" data in the cells connected to a "H" level bit line. After data are written, the potentials of the block selection signal BS and the plate line connection signal PS change from "H" level to "L" level to disconnect the memory cell group from the bit line and to disconnect the memory cell group from the plate line PL, before the selected word lines ("L" level) change to unselected state ("H" level). After the potential of the plate line PL has changed to "L" level, the selected word line WL is kept in the selected state ("L" state) for a predetermined time. After the selected word line WL is set in the unselected state ("H" level), the plate line connection signal PS is set at "H" level. While the word line is being selected, the bit line potential is continuously applied to the node A, and the voltage of the plate line PL ("L") is continuously applied to the node B. Hence, the write voltage is applied to the ferroelectric capacitor in the memory cell A. During this time, the ferroelectric capacitor can be continuously set in a "1" data write state, so the data can be sufficiently written.

In this embodiment, when the word line is set at "H" level, and the potentials at the two terminals of the ferroelectric capacitor of the memory cell 42 are short-circuited, the nodes A and B have almost the same time constant.

In the first embodiment, the plate line PL is connected to a large number of bit lines and has a large capacitance (plate capacitance), and thus the time constant of the node A considerably differs from that of the node B to differentiate the changes of the potentials thereof, with the result that unintentional stress may be applied to the cells. In this fifth embodiment, however, the capacitance unbalance of the nodes A and B is removed so that the unintentional stress may be prevented.

In this embodiment as well, even when a write in a memory cell is continued after the block selection signal BS has changed to "L" level, the GND potential can be set in this example by bit line precharge to prepare for the next read cycle. Hence, a high-speed cycle can be realized.

In writing data, not read information but information according to external input is written. As the write operation, the same operation as a rewrite operation after a read is performed in the same timing. Hence, since the word line is kept selected after the potential of the plate line PL has changed to "L" level, the voltage can be continuously applied to the ferroelectric capacitor in the memory cell 42 even after the write, and the "1" data can be sufficiently written.

In the fifth embodiment as well, the same effect as in the first embodiment can be obtained.

SIXTH EMBODIMENT

The address buffer arrangement, overall device arrangement, and cell array structure of the sixth embodiment are the same as those of the fifth embodiment shown in FIGS. 4, 13, and 14. The read method is the same as in the fifth embodiment, and the rewrite timing is different.

Figure 17:
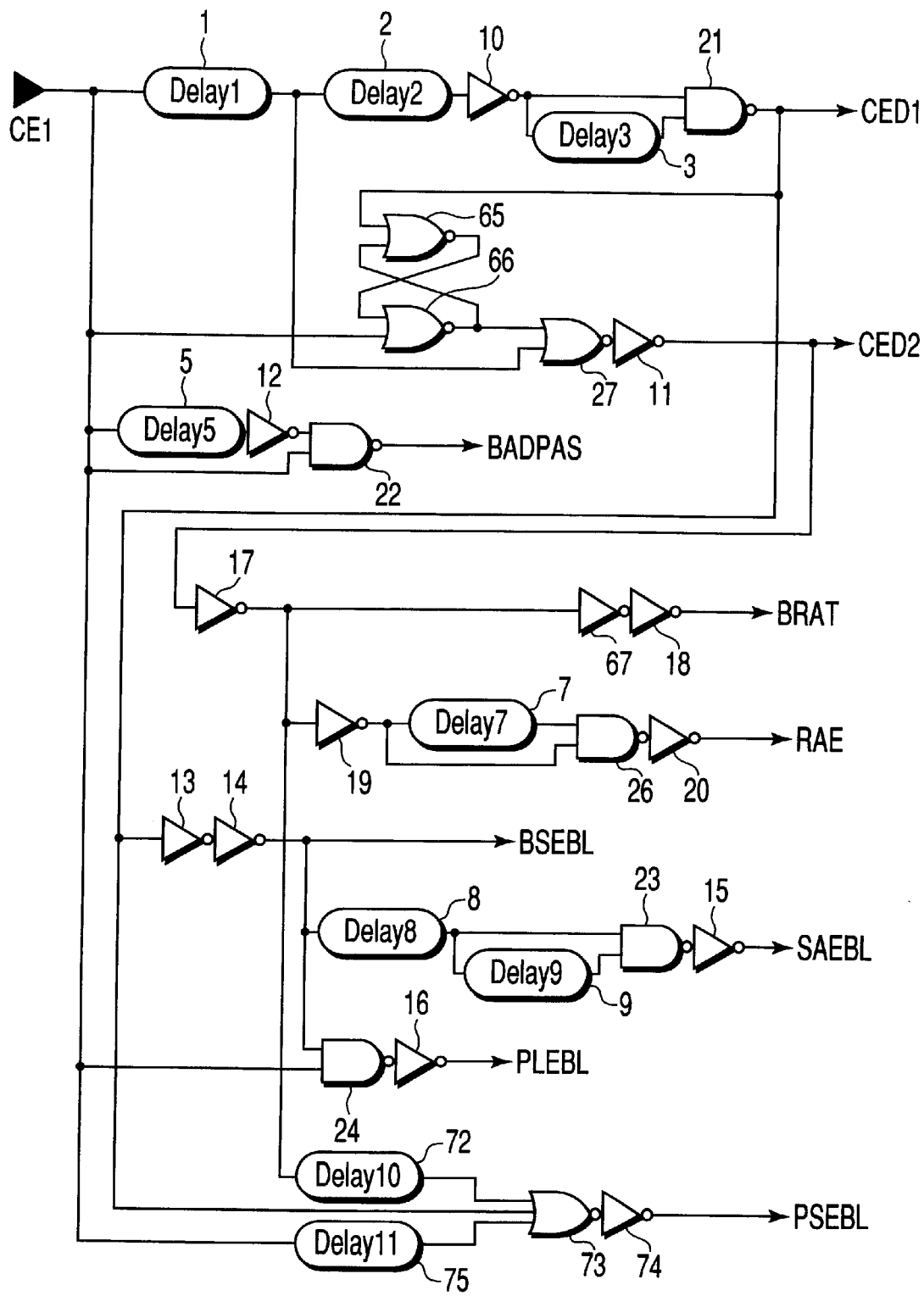
FIG. 17 is a view showing the arrangement of a control circuit according to the sixth embodiment of the present invention.

FIG. 17 is a view showing the arrangement of a control circuit according to this embodiment. The control circuit of this embodiment is almost the same as the control circuit of the second embodiment. Unlike the second embodiment, a 10th delay circuit 72 for receiving the output signal for an eighth inverter 17 is provided, and a 11th delay circuit 75 for receiving a chip enable signal CE1 is added. A second NOR circuit 73 for receiving the output signals from the 10th delay circuit 72 and 11th delay circuit 75 and a first chip enable delay signal CED1 is also added. In addition, a 12th inverter 74 for receiving the output signal from the second NOR circuit 73 is also added. The 12th inverter 74 outputs a plate line connection enable signal PSEBL.

FIG. 18 is a timing chart showing main signals according to the sixth embodiment and operation waveform at a node. Referring to FIG. 18, the signals are synchronized at timings indicated by dotted lines.

In this embodiment, operation until the timing when a block selection signal BS changes for "H" level to "L" level is the same as in the fifth embodiment. Subsequent operation waveforms are the same as in the second embodiment except a plate line connection signal PS. The plate line connection signal PS changes from "L" level to "H" level after the elapse of time (10) from the timing when a second chip enable delay signal CED2 has changed from "H" level to "L" level.

For a "1" data rewrite in this embodiment, after the plate line PL2 changes to "L" level, the selected word line WL1 is set in the unselected state at the trailing edge of the external chip enable signal CEB. With this operation, "1" data can be written until the start of the next read cycle. Hence, the "1" data can be sufficiently written.

In the sixth embodiment as well, the same effect as in the fifth embodiment can be obtained.

SEVENTH EMBODIMENT

The address buffer arrangement, overall device arrangement, and cell array structure of the seventh embodiment are the same as those of the fifth embodiment shown in FIGS. 4, 13, and 14. The read method is the same as in the fifth embodiment. The voltage of a plate line PL differs from that in the fifth embodiment and is fixed to a voltage (e.g., ½ of the power supply voltage). Also, the bit line precharge potential differs from that in the fifth embodiment and is ½ of the power supply voltage.

Figure 19:
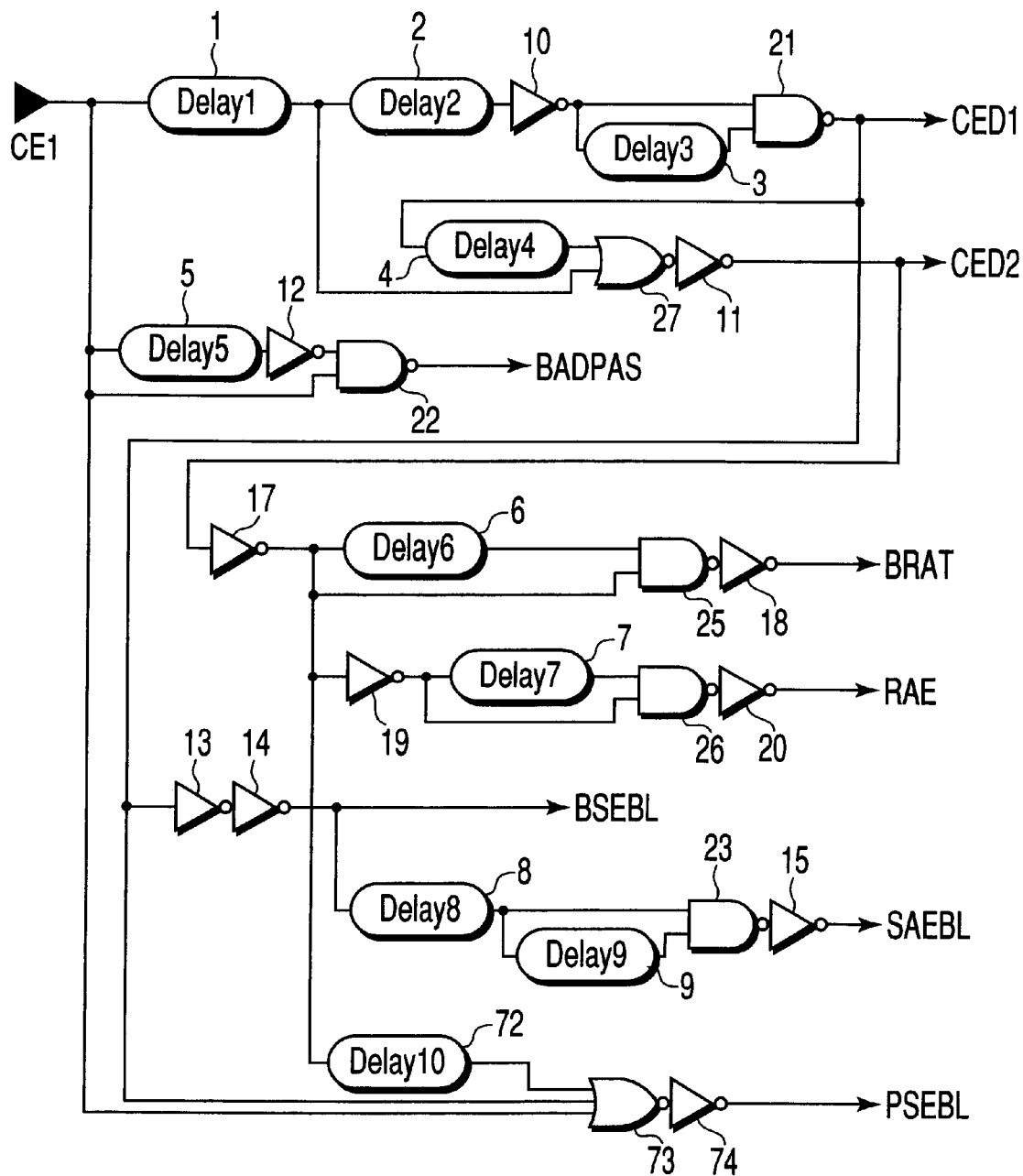
FIG. 19 is a view showing the arrangement of a control circuit according to the seventh embodiment of the present invention.

FIG. 19 is a view showing the arrangement of a control circuit according to the seventh embodiment, which is almost the same as in the third embodiment. However, in addition to the control circuit of the third embodiment, a 10th delay circuit 72 for receiving the output signal for an eighth inverter 17 is provided, and a second NOR circuit 73 for receiving the output signal from the 10th delay circuit 72, a first chip enable delay signal CED1, and an external chip enable signal CE1 is added. In addition, a 12th inverter 74 for receiving the output signal from the second NOR circuit 73 is also added. The 12th inverter 74 outputs a plate line connection enable signal PSEBL.

Figure 20:
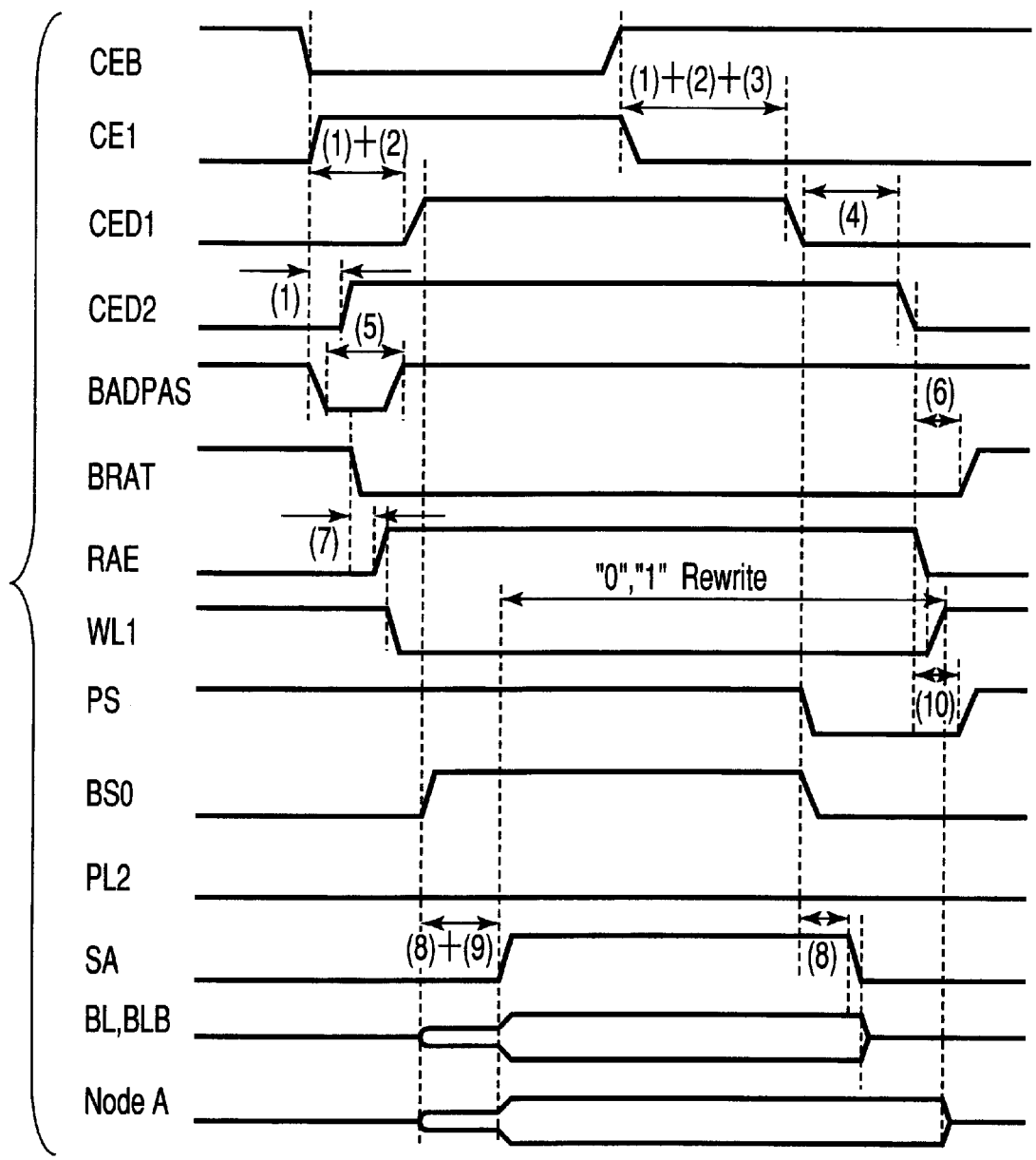
FIG. 20 is a timing chart showing operation according to the seventh embodiment of the present invention.

FIG. 20 is a timing chart showing main signals and signals at the node in a read in the seventh embodiment. Referring to FIG. 20, the signals are synchronized at timings indicated by dotted lines.

The timing chart is almost the same as in the third embodiment except that the waveform of a plate line connection signal PS is added. The waveform of the plate line connection signal PS is the same as in the fifth embodiment.

In this embodiment, the voltage of a plate line PL is fixed to a voltage (e.g., ½ of the power supply voltage).

In the standby state, a chip enable signal CEB is at "H", word lines WL0 to WL7 are at "H", block selection signals BS0 and BS1 are at "L", plate lines PL1 and PL2 are at "½ of the power supply voltage", bit lines BL and BLB are at "½ of the power supply voltage", plate line connection signals PS0 and PSI are at "H", and the nodes (e.g., nodes A and B) in the memory cell group are at "½ of the power supply voltage". In a read, the memory cell is activated by the external chip enable signal CEB at "L" level, and a word line WLi and block selection line BSi selected by an external address are selected. In this case, a memory cell 42 is selected by the word line WL1 and block selection line BS0 and connected to the bit line BLB.

In this embodiment, no reference cell is used, and whether cell information is "1" or "0" is determined depending on whether the bit line potential is higher or lower than ½ of the power supply voltage.

A rewrite after the read is done by applying the bit line potential and plate line potential to the two terminals of the ferroelectric capacitor after sensing the bit line. After the bit line potential is amplified by a sense amplifier, the word line WL is kept selected even after the block selection signal BS and plate line connection signal PS change to $^{11}$" level. With this operation, the write voltage is applied to a capacitor until the word line is set in the unselected state and the potentials at the two terminals of a ferroelectric capacitor 41 in the memory cell 42 are short-circuited.

In this embodiment, both "0" data and "1" data are written at this timing.

As shown in FIG. 20, for a "1" data write, the bit line potential after sensing, i.e., the power supply voltage (e.g., 3.3 V) is applied to the node A, and the potential of the plate line PL, i.e., ½ of the power supply voltage, 1.6 V, is applied to the node B. With this operation, a "1" data write state is set.

For a "0" data write, the bit line potential after sensing, i.e., a potential GND (e.g., 0 V) is applied to the node A, and the potential of the plate line PL, i.e., ½ of the power supply voltage (1.6 V) is applied to the node B. With this operation, a "0" data write state is set.

After the word line changes to "H" level, the plate line connection signal PS is set at "H" level to connect the memory cell group 43 and plate line PL. After the bit line potential is made sure until the word line is set in the unselected state, the ferroelectric capacitor can be continuously set in the "1" data write state, so the data can be sufficiently written.

In this embodiment, when the word line is set at "H" level, and the potentials at the two terminals of the ferroelectric capacitor of the memory cell 42 are short-circuited, the nodes A and B have almost the same time constant.

In the first embodiment, the plate line PL is connected to a large number of bit lines and has a large capacitance (plate capacitance), and thus the time constant of the node A considerably differs from that of the node B to differentiate the changes of the potentials thereof, with the result that unintentional stress may be applied to the cells. In this fifth embodiment, however, the capacitance unbalance of the nodes A and B is removed so that the unintentional stress may be prevented.

In the seventh embodiment as well, the same effect as in the fifth embodiment can be obtained.

EIGHTH EMBODIMENT

The address buffer arrangement, overall device arrangement, and cell array structure of the eighth embodiment are the same as those of the fifth embodiment shown in FIGS. 4, 13, and 14. The read method is the same as in the fifth embodiment, and the rewrite timing is different.

This eighth embodiment is a combination of the sixth and seventh embodiments.

In this embodiment, the rewrite timing is the same as in the sixth embodiment, and the voltage of the plate line PL is the same as in the seventh embodiment and is fixed to a voltage (e.g., ½ of the power supply voltage).

FIG. 21 is a view showing the arrangement of a control circuit according to the eighth embodiment, which is almost the same as in the fourth embodiment. However, in addition to the control circuit of the fourth embodiment, a 10th delay circuit 72 for receiving the output signal for an eighth inverter 17 is provided, and a 11th delay circuit 75 for receiving an external chip enable signal CE1 is added. A second NOR circuit 73 for receiving the output signals from the 10th delay circuit 72 and 11th delay circuit 75 and a first chip enable delay signal CED1 is also added.

In addition, a 12th inverter 74 for receiving the output signal from the second NOR circuit 73 is also added. The 12th inverter 74 outputs a plate line connection enable signal PSEBL as an inverted signal.

Figure 22:
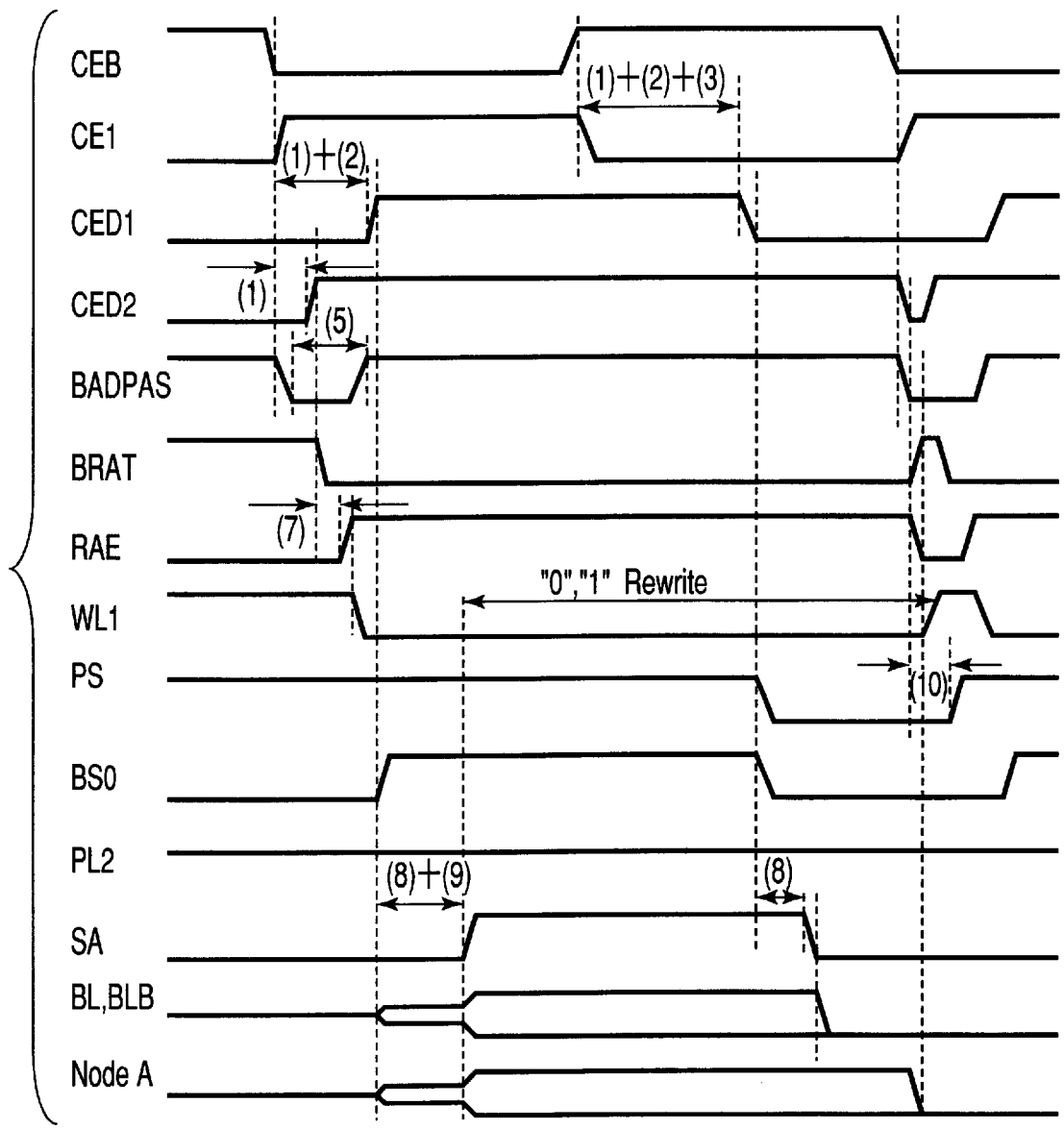
FIG. 22 is a timing chart showing operation according to the eighth embodiment of the present invention.

FIG. 22 is a timing chart showing main signals and signals at the node in a read in the eighth embodiment. Referring to FIG. 22, the signals are synchronized at timings indicated by dotted lines.

The timing chart is almost the same as in the fourth embodiment except that the waveform of a plate line connection signal PS is added. The waveform of the plate line connection signal PS is the same as in the sixth embodiment.

In this embodiment, the voltage of a plate line PL is fixed to a voltage (e.g., ½ of the power supply voltage).

In the eighth embodiment as well, the same effect as in the fifth embodiment can be obtained. Also, the bit line precharge potential is ½ of the power supply voltage.

NINTH EMBODIMENT

The overall device arrangement, cell array structure, and address buffer arrangement of the ninth embodiment are the same as those of the first embodiment shown in FIGS. 2, 3, and 4. Further, the control circuit has the same structure as the control circuit I illustrated in FIG. 1 which is referred to in the first embodiment. The read method is the same as in the first embodiment, and the rewrite timing is also the same. The bit line precharge potential differs from that of the first embodiment and is the power supply voltage. The operation of the ninth embodiment will be described below, mainly with regard to the different points from the first embodiment.

Figure 23:
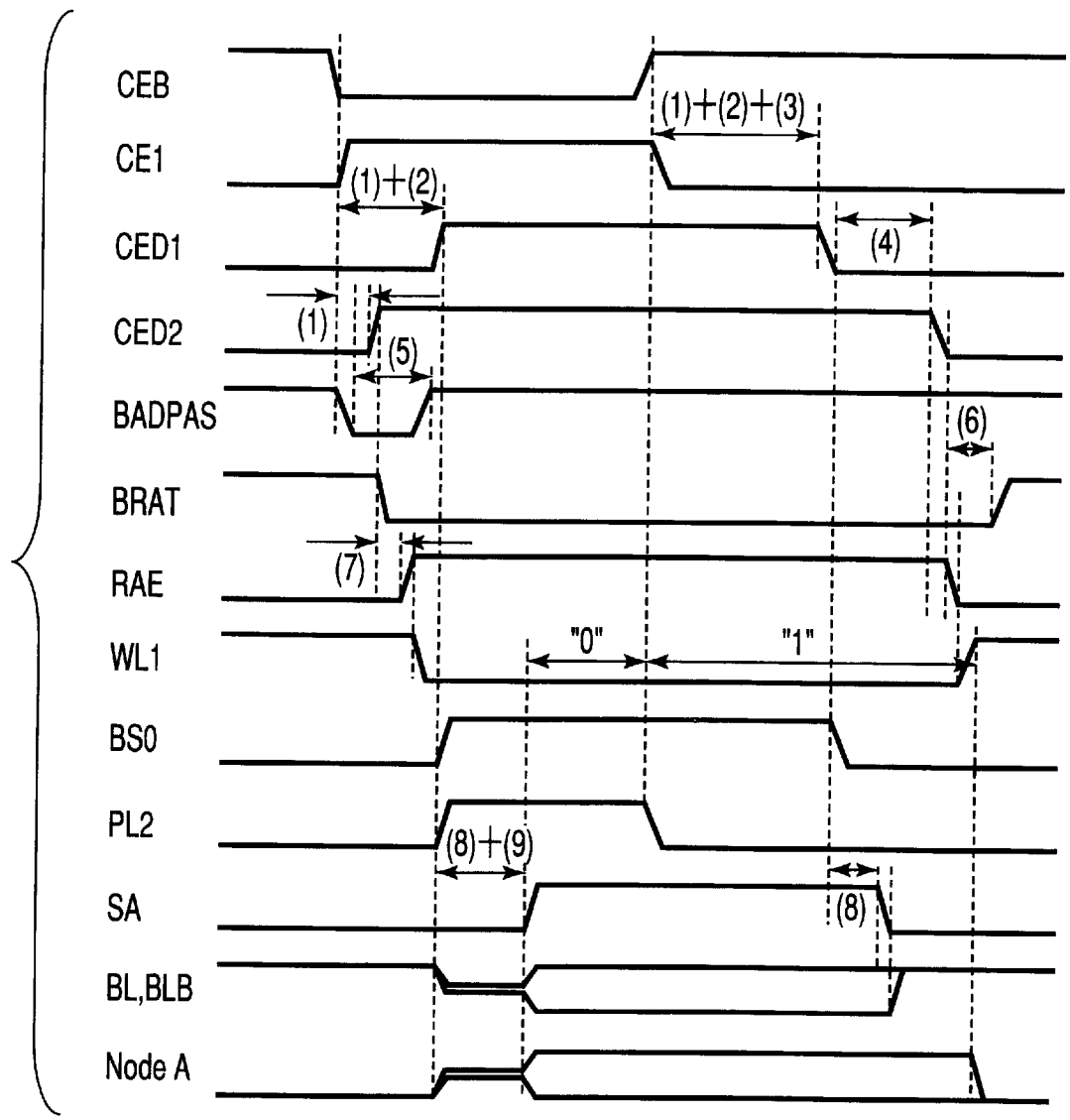
FIG. 23 is a timing chart showing operation according to the ninth embodiment of the present invention.

FIG. 23 is a timing chart showing main signals according to the ninth embodiment and their waveforms in reading from a node. Referring to FIG. 23, the signals are synchronized at timings indicated by dotted lines.

In a state where the potential of the block selection signal BS0 is at "L" level, the memory cell group is disconnected from the bit line BLB, and the bit line BLB remains at "H" level (i.e., power supply voltage in this embodiment). When the potential of the block selection signal BS0 rises from "L" level to "H" level, the memory cell group is connected to the bit line BLB. The charge in a selected memory cell is transferred to the bit line BLB. When the potential of the plate line PL2 rises from "L" level to "H" level, the potential of the bit line BLB changes to the potential that corresponds to the data stored in the selected memory cell. The potential of the bit line BLB is amplified by the sense amplifier SA when the potential of the sense amplifier SA rises from "L" level to "H" level. The potential of the bit line BLB therefore changes to either "H" level or "L" level, in accordance with the data stored in the memory cell. If the potential of the bit line BLB is "H" level, it falls to "L" level when the sense amplifier control signal SA falls from "H" level to "L" level.

When the second chip enable delay signal CED2 falls from "H" level to "L" level, the row address enable signal RAE falls from "H" level to "L" level.

When the row address enable signal RAE falls from "H" level to "L" level, the decoder becomes unselected. The potential of the word line WL1 therefore changes from "L" level to "H" level. The word line becomes unselected to short-circuit both ends of the memory cell.

When the potential of the word line WL1 rises from "L" level to "H" level, the potential of the node A changes to "0" level and becomes equal to the potential of the plate line PL2.

As seen from FIG. 23, in a rewrite after the read, "0" data is rewritten in the memory cell, while the plate line PL and the bit line BLB remains at "H" level and "L" level, respectively.

The "1" data rewrite continues for a predetermined time, until the word line WL1 become unselected even after the potential of the plate line PL2 has fallen.

Similarly, data rewrite continues for a predetermined time, until the word line WL1 become unselected even after the potential of the plate line PL2 has fallen.

The ninth embodiment can attain the same advantage as the first embodiment.

TENTH EMBODIMENT

The overall device arrangement, cell array structure, and address buffer arrangement of the ninth embodiment are the same as those of the first embodiment shown in FIGS. 2, 3, and 4. Further, the control circuit has the same structure as the control circuit I illustrated in FIG. 7 which is referred to in the second embodiment. The read method is the same as in the first embodiment, and the rewrite timing is different from that of the first embodiment. The bit line precharge potential differs from that of the first embodiment and is the power supply voltage. The operation of the ninth embodiment will be described below, mainly with regard to the different points from the second embodiment.

Figure 24:
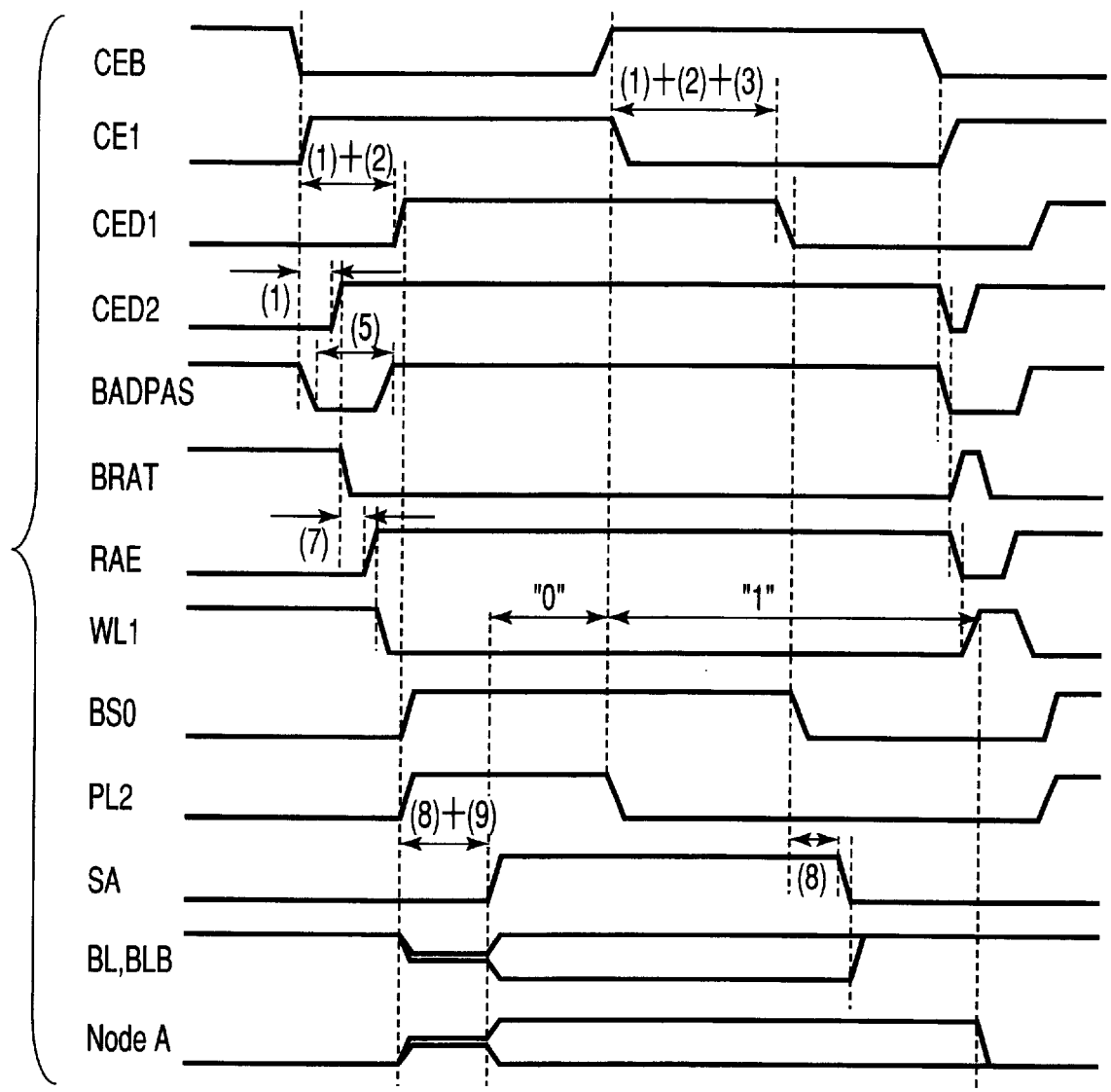
FIG. 24 is a timing chart showing operation according to the tenth embodiment of the present invention.

FIG. 24 is a timing chart showing main signals according to the ninth embodiment and their waveforms in reading from a node. Referring to FIG. 24, the signals are synchronized at timings indicated by dotted lines.

In a state where the potential of the block selection signal BS0 is at "L" level, the memory cell group is disconnected from the bit line BLB, and the bit line BLB remains at "H" level (i.e., power supply voltage in this embodiment). When the potential of the block selection signal BS0 rises from "L" level to "H" level, the memory cell group is connected to the bit line BLB. The charge in a selected memory cell is transferred to the bit line BLB. When the potential of the plate line PL2 rises from "L" level to "H" level, the potential of the bit line BLB changes to the potential that corresponds to the data stored in the selected memory cell. The potential of the bit line BLB is amplified by the sense amplifier SA when the potential of the sense amplifier SA rises from "L" level to "H" level. The potential of the bit line BLB therefore changes to either "H" level or "L" level, in accordance with the data stored in the memory cell. If the potential of the bit line BLB is "H" level, it falls to "L" level when the sense amplifier control signal SA falls from "H" level to "L" level.

When the second chip enable delay signal CED2 falls from "H" level to "L" level, the row address enable signal RAE falls from "H" level to "L" level.

When the row address enable signal RAE falls from "H" level to "L" level, the decoder becomes unselected.

The potential of the word line WL1 therefore changes from "L" level to "H" level.

When the potential of the word line WL1 rises from "L" level to "H" level, the potential of the node A changes to "0" level.

As seen from FIG. 24, in rewrite after the read, "0" data is rewritten in the memory cell, while the plate line PL and the bit line BLB remains at "H" level and "L" level, respectively.

For a "1" data rewrite, after the plate line PL2 changes to "L" level, the selected word line WL1 is set in the unselected state at the trailing edge of the external chip enable signal CEB. With this operation, "1" data can be written until the start of the next read cycle or the start of the next write cycle. Hence, the "1" data can be sufficiently written.

For a data write as well, after the potential of the plate line PL2 changes to "L" level, the selected word line WL1 is set in the unselected state at the trailing edge of the external chip enable signal CEB.

In the tenth embodiment as well, the same effect as in the second embodiment can be obtained.

ELEVENTH EMBODIMENT

The address buffer arrangement of the eleventh embodiment is the same as that of the first embodiment shown in FIG. 4. The read method is the same as in the first embodiment. Further, the control circuit has the same structure as the control circuit I illustrated in FIG. 15 which is referred to in the fifth embodiment.

Also, in the eleventh embodiment, like the fifth embodiment, a switch drive circuit 70 (FIG. 13) for connecting or disconnecting a memory cell to or from a plate line is added and the drive method to release the selection of the word line is different from the first embodiment.

The bit line precharge potential differs from that of the first embodiment and is the power supply voltage. The operation of the ninth embodiment will be described below, mainly with regard to the different points from the fifth embodiment.

Figure 25:
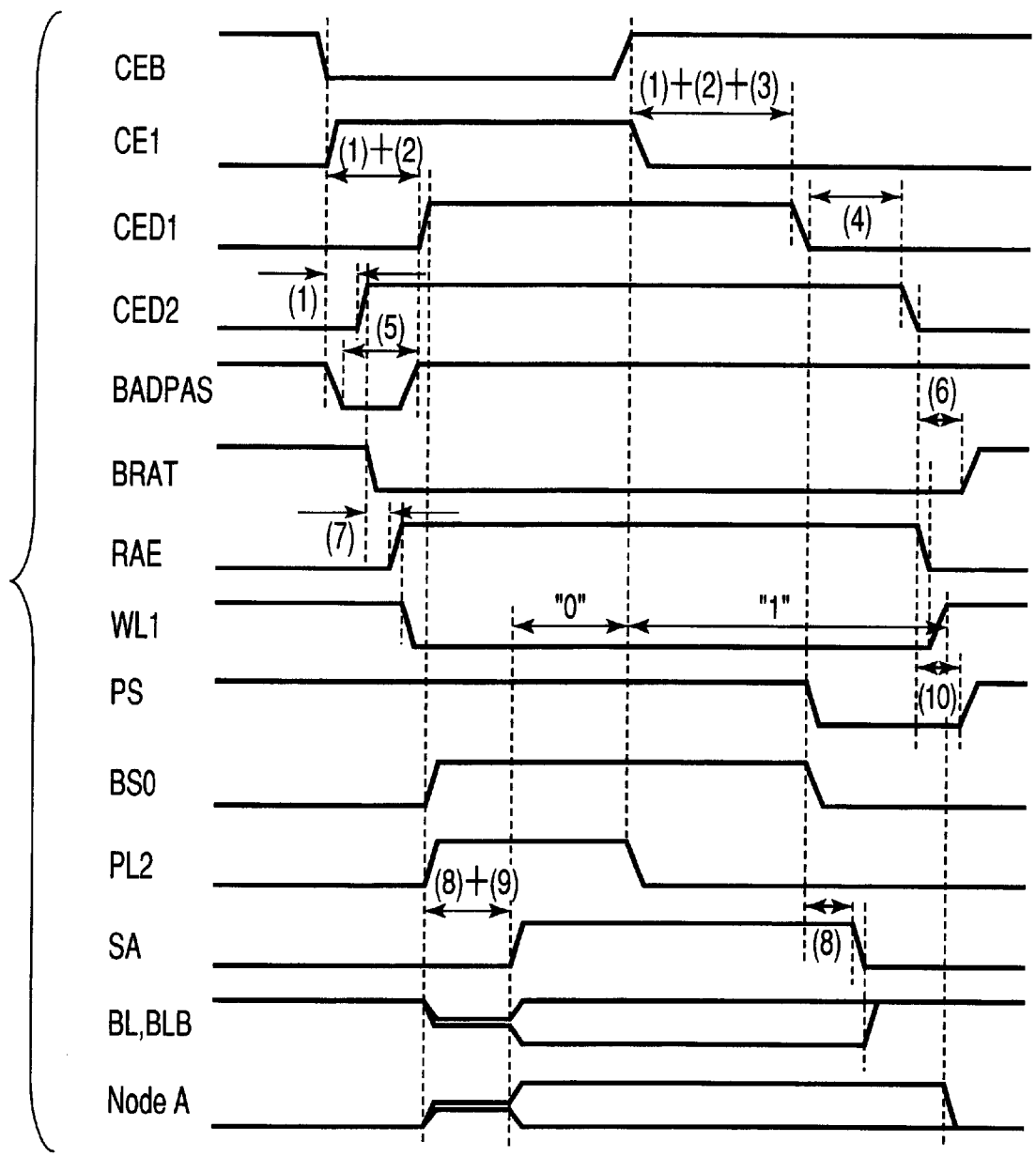
FIG. 25 is a timing chart showing operation according to the eleventh embodiment of the present invention.
Figure 27:
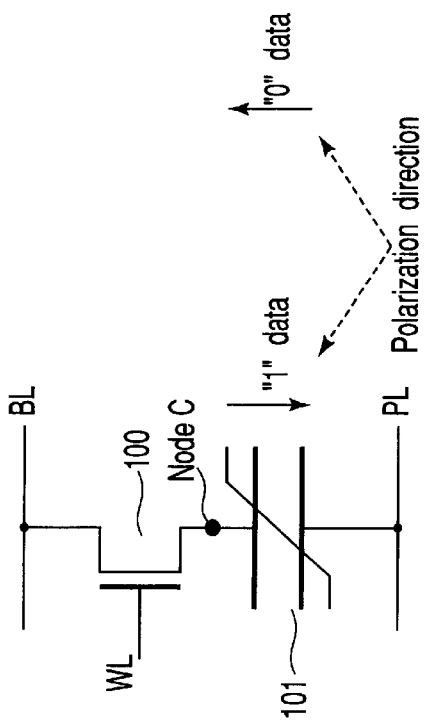
FIG. 27 is a circuit diagram showing the polarization direction and memory contents of a conventional ferroelectric memory.
Figure 28:
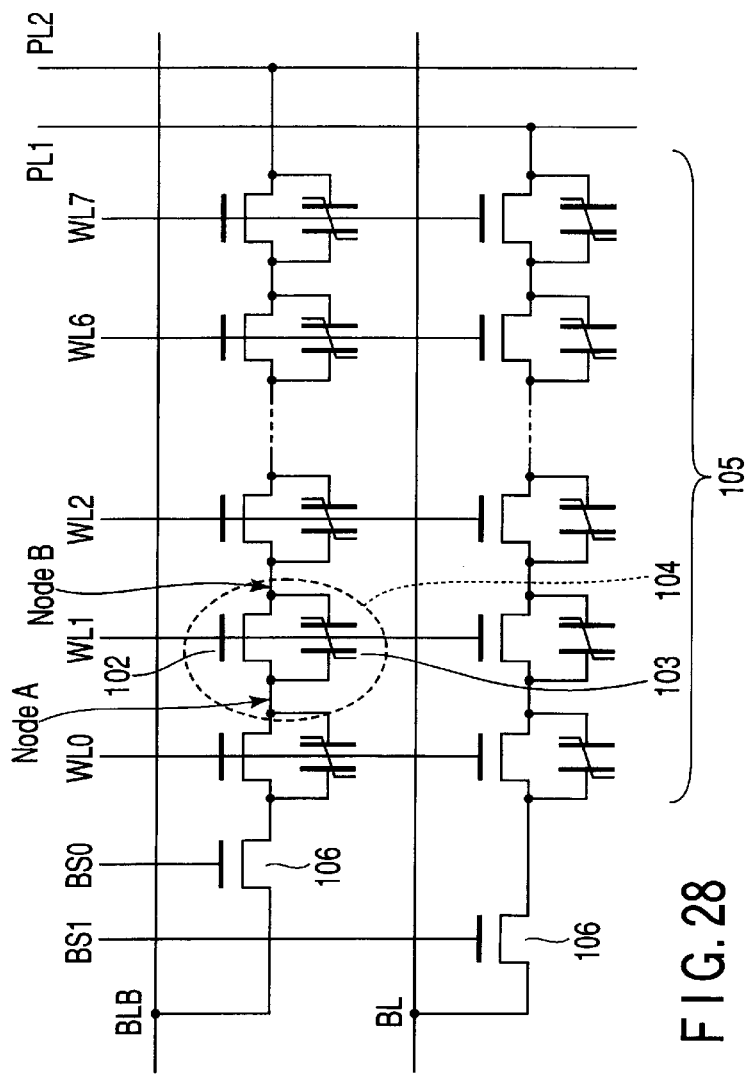
FIG. 28 is a circuit diagram showing the memory cell array structure of a conventional TC parallel unit series connection type ferroelectric memory.

FIG. 25 is a timing chart showing main signals according to the eleventh embodiment and their waveforms in reading from a node. Referring to FIG. 25, the signals are synchronized at timings indicated by dotted lines.

In a state where the potential of the block selection signal BS0 is at "L" level, the memory cell group is disconnected from the bit line BLB, and the bit line BLB remains at "H" level (i.e., power supply voltage in this embodiment). When the potential of the block selection signal BS0 rises from "L" level to "H" level, the memory cell group is connected to the bit line BLB. The charge in a selected memory cell is transferred to the bit line BLB. When the potential of the plate line PL2 rises from "L" level to "H" level, the potential of the bit line BLB changes to the potential that corresponds to the data stored in the selected memory cell. The potential of the bit line BLB is amplified by the sense amplifier SA when the potential of the sense amplifier SA rises from "L" level to "H" level. The potential of the bit line BLB therefore changes to either "H" level or "L" level, in accordance with the data stored in the memory cell. If the potential of the bit line BLB is "H" level, it falls to "L" level when the sense amplifier control signal SA falls from "H" level to "L" level.

When the second chip enable delay signal CED2 falls from "H" level to "L" level, the row address enable signal RAE falls from "H" level to "L" level.

When the row address enable signal RAE falls from "H" level to "L" level, the decoder becomes unselected. The potential of the word line WL1 therefore changes from "L" level to "H" level. The word line becomes unselected to short-circuit both ends of the memory cell.

When the potential of the word line WL1 rises from "L" level to "H" level, the potential of the node A changes to "0" level and becomes equal to the potential of the plate line PL2.

As seen from FIG. 25, in a rewrite after the read, "0" data is rewritten in the memory cell, while the plate line PL and the bit line BLB remains at "H" level and "L" level, respectively.

The "1" data rewrite continues for a predetermined time, until the word line WL1 become unselected even after the potential of the plate line PL2 has fallen.

Similarly, data rewrite continues for a predetermined time, until the word line WL1 become unselected even after the potential of the plate line PL2 has fallen.

The eleventh embodiment can attain the same advantage as the fifth embodiment.

TWELFTH EMBODIMENT

The address buffer, the overall configuration and cell array are the same as shown in FIG. 4, FIG. 13 and FIG. 14, respectively. Further, the control circuit has the same structure as the control circuit of the sixth embodiment, which is illustrated in FIG. 17.

The address buffer arrangement, overall device arrangement, and cell array structure of the twelfth embodiment are the same as those of the fifth embodiment shown in FIGS. 4, 13, and 14. The read method is the same as in the fifth embodiment, and the rewrite timing is different from that of the fifth embodiment. Further, the control circuit has the same structure as the control circuit I illustrated in FIG. 17 which is referred to in the sixth embodiment. The bit line precharge potential differs from that of the first embodiment and is the power supply voltage. The operation of the twelfth embodiment will be described below, mainly with regard to the different points from the sixth embodiment.

FIG. 26 is a timing chart showing main signals according to the twelfth embodiment and their waveforms in reading from a node. Referring to FIG. 26, the signals are synchronized at timings indicated by dotted lines.

In a state where the potential of the block selection signal BS0 is at "L" level, the memory cell group is disconnected from the bit line BLB, and the bit line BLB remains at "H" level (i.e., power supply voltage in this embodiment). When the potential of the block selection signal BS0 rises from "L" level to "H" level, the memory cell group is connected to the bit line BLB. The charge in a selected memory cell is transferred to the bit line BLB. When the potential of the plate line PL2 rises from "L" level to "H" level, the potential of the bit line BLB changes to the potential that corresponds to the data stored in the selected memory cell. The potential of the bit line BLB is amplified by the sense amplifier SA when the potential of the sense amplifier SA rises from "L" level to "H" level. The potential of the bit line BLB therefore changes to either "H" level or "L" level, in accordance with the data stored in the memory cell. If the potential of the bit line BLB is "H" level, it falls to "L" level when the sense amplifier control signal SA falls from "H" level to "L" level.

When the second chip enable delay signal CED2 falls from "H" level to "L" level, the row address enable signal RAE falls from "H" level to "L" level.

When the row address enable signal RAE falls from "H" level to "L" level, the decoder becomes unselected. The potential of the word line WL1 therefore changes from "L" level to "H" level.

When the potential of the word line WL1 rises from "L" level to "H" level, the potential of the node A changes to "0" level.

In a rewrite after the read, "0" data is rewritten in the memory cell, while the plate line PL and the bit line BLB remains at "H" level and "L" level, respectively.

As shown in FIG. 26, for a "1" data rewrite, after the plate line PL2 changes to "L" level, the selected word line WL1 is set in the unselected state at the trailing edge of the external chip enable signal CEB. With this operation, "1" data can be written until the start of the next read cycle or the start of the next write cycle. Hence, the "1" data can be sufficiently written.

For a data write as well, after the potential of the plate line PL2 changes to "L" level, the selected word line WL1 is set in the unselected state at the trailing edge of the external chip enable signal CEB.

In the twelfth embodiment as well, the same effect as in the sixth embodiment can be obtained.

As is apparent from the above-described embodiments, according to the present invention, a semiconductor memory device having a ferroelectric memory device which can sufficiently write cell data and has an improved data holding characteristic can be provided.

What is claimed is:

1. A semiconductor memory device comprising:
   a plurality of memory cells coupled in series to form a memory cell block, which data is read out and data is written in, each memory cell having a cell transistor for selecting said memory cell and a ferroelectric capacitor coupled between a source and a drain of said cell transistor;
   a word line coupled to a gate of said cell transistor;
   a memory cell block selection transistor coupled to one terminal of said memory cell block of said plurality of memory cells;
   a bit line coupled to said memory cell block selection transistor;
   a plate line coupled to the other terminal of said memory cell block of said plurality of memory cells; and
   a word line control circuit configured to control said word line to keep said cell transistor selected even after said memory cell block selection transistor is turned off.

2. A semiconductor memory device according to claim 1, wherein said cell transistor is kept selected until a next read or write operation is performed after said memory cell block selection transistor is turned off.

3. A semiconductor memory device according to claim 1, wherein said cell transistor is kept selected for a predetermined time period after said memory cell block selection transistor is turned off.

4. A semiconductor memory device according to claim 1, wherein said control circuit comprises a delay circuit configured to define said predetermined time period.

5. A semiconductor memory device according to claim 1, wherein said control circuit performs said controlling of said word line in such a manner that said word line is kept selected to keep said cell transistor selected, until a level of a chip enable signal is changed after said block selection transistor is turned off.

6. A semiconductor memory device according to claim 1, wherein said word line is kept selected to keep said cell transistor selected, until a next read or write operation is performed after said memory cell block selection transistor is turned off.

7. A semiconductor memory device according to claim 4, wherein said word line is kept selected to keep said cell transistor selected for said predetermined time period defined by said delay circuit, after said memory cell block selection transistor is turned off.

8. A semiconductor memory device according to claim 1, wherein said word line is kept selected to said keeping of said cell transistor selected is to keep said cell transistor turned off to keep both terminals of said ferroelectric capacitor uncoupled from each other.

9. A semiconductor memory device according to claim 1, wherein a precharge potential for said bit line is the ground potential.

10. A semiconductor memory device according to claim 1, wherein a precharge potential for said bit line is ½ of a power supply voltage.

11. A semiconductor memory device according to claim 1, wherein a precharge potential for said bit line is a power supply voltage.

12. A semiconductor memory device comprising:
   a plurality of memory cells coupled in series to form a memory cell block, which data is read out and data is written in, each memory cell having a cell transistor for selecting said memory cell and a ferroelectric capacitor coupled between a source and a drain of said cell transistor;
   a word line coupled to a gate of said cell transistor;
   a memory cell block selection transistor coupled to one terminal of said memory cell block of said plurality of memory cells;
   a bit line coupled to said memory cell block selection transistor;
   a plate line selection transistor coupled to the other terminal of said memory cell block of said plurality of memory cells;
   a plate line coupled to said plate line selection transistor; and
   a word line control circuit configured to control said word line to keep said cell transistor selected even after said memory cell block selection transistor and said plate line selection transistor are turned off.

13. A semiconductor memory device according to claim 12, wherein said plate line selection transistor is controlled by a plate line selection signal to connect or disconnect said memory cell block to or from said plate line.

14. A semiconductor memory device according to claim 12, wherein said cell transistor is kept selected until a next read or write operation is performed after said memory cell block selection transistor is turned off.

15. A semiconductor memory device according to claim 12, wherein said cell transistor is kept selected for a predetermined time period after said memory cell block selection transistor is turned off.

16. A semiconductor memory device according to claim 12, wherein said control circuit comprises a delay circuit configured to control said predetermined time period.

17. A semiconductor memory device according to claim 12, wherein said control circuit performs said controlling of said word line in such a manner that said word line is kept selected to keep said cell transistor selected, until a level of a chip enable signal is changed after said block selection transistor is turned off.

18. A semiconductor memory device according to claim 12, wherein said word line is kept selected to keep said cell transistor selected, until a next read or write operation is performed after said memory cell block selection transistor is turned off.

19. A semiconductor memory device according to claim 16, wherein said word line is kept selected to keep said cell transistor selected for said predetermined time period defined by said delay circuit, after said memory cell block selection transistor is turned off.

20. A semiconductor memory device according to claim 12, wherein said word line is kept selected to said keeping of said cell transistor selected is to keep said cell transistor turned off to keep both terminals of said ferroelectric capacitor uncoupled from each other.

21. A semiconductor memory device according to claim 12, wherein a precharge potential for said bit line is the ground potential.

22. A semiconductor memory device according to claim 12, wherein a precharge potential for said bit line is ½ of a power supply voltage.

23. A semiconductor memory device according to claim 12, wherein a precharge potential for said bit line is a power supply voltage.

* * * * *